United States Patent
Nishizawa et al.

(10) Patent No.: US 12,407,323 B2
(45) Date of Patent: Sep. 2, 2025

(54) VIBRATOR DEVICE

(71) Applicant: SEIKO EPSON CORPORATION, Tokyo (JP)

(72) Inventors: Ryuta Nishizawa, Nagano (JP); Junichi Takeuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 18/427,344

(22) Filed: Jan. 30, 2024

(65) Prior Publication Data

US 2024/0258988 A1  Aug. 1, 2024

(30) Foreign Application Priority Data

Jan. 31, 2023  (JP) ................. 2023-012739

(51) Int. Cl.
| | |
|---|---|
| *H03H 9/05* | (2006.01) |
| *H03B 5/04* | (2006.01) |
| *H03B 5/32* | (2006.01) |
| *H03H 9/02* | (2006.01) |
| *H03H 9/19* | (2006.01) |

(52) U.S. Cl.
CPC ............ *H03H 9/0547* (2013.01); *H03B 5/04* (2013.01); *H03B 5/32* (2013.01); *H03H 9/02102* (2013.01); *H03H 9/19* (2013.01)

(58) Field of Classification Search
CPC .... H03H 9/0547; H03H 9/02102; H03H 9/19; H03B 5/04; H03B 5/32
See application file for complete search history.

(56) References Cited

U.S. PATENT DOCUMENTS

| | | |
|---|---|---|
| 2015/0349746 A1 | 12/2015 | Yamazaki et al. |
| 2016/0164490 A1* | 6/2016 | Kamijo ............... H03H 9/0509 29/25.35 |
| 2022/0173715 A1 | 6/2022 | Takeuchi et al. |
| 2022/0239275 A1 | 7/2022 | Itasaka |
| 2022/0286107 A1 | 9/2022 | Kitahara |
| 2022/0311414 A1* | 9/2022 | Nomura ............... H03H 9/08 |

FOREIGN PATENT DOCUMENTS

| | | | |
|---|---|---|---|
| JP | 2007180885 | * 7/2007 | ............... H03B 5/32 |
| JP | 2015-226242 A | 12/2015 | |
| JP | 2021-57755 A | 4/2021 | |
| JP | 2022-85834 A | 6/2022 | |
| JP | 2022-114779 A | 8/2022 | |
| JP | 2022-134787 A | 9/2022 | |

OTHER PUBLICATIONS

Machine translation of JP2007-180885 (Year: 2007).*
Machine translation of JP2007180885.*

* cited by examiner

*Primary Examiner* — Jeffrey M Shin
(74) *Attorney, Agent, or Firm* — Rankin, Hill & Clark LLP

(57) ABSTRACT

A vibrator device includes: a base including a semiconductor substrate having an integrated circuit disposed at a first surface; a vibration element electrically coupled to the integrated circuit; and a lid having an end surface of a side wall bonded to the first surface at a bonding portion. A first circuit of the integrated circuit includes a first circuit element disposed in a first region overlapping the bonding portion in a plan view. The first circuit element is a passive element or a transistor, and $\theta<90°$ is satisfied, $\theta$ being an angle formed by the first surface and an inner side surface of the side wall.

19 Claims, 24 Drawing Sheets

VIBRATOR DEVICE

The present application is based on, and claims priority from JP Application Serial Number 2023-012739, filed Jan. 31, 2023, the disclosure of which is hereby incorporated by reference herein in its entirety.

BACKGROUND

1. Technical Field

The present disclosure relates to a vibrator device.

2. Related Art

A vibrator device such as an oscillator is known as a device using a vibration element. As such a vibrator device, for example, an oscillator is known in which a vibration element is accommodated in a first recess of a package having an H-shaped cross section, and an integrated circuit (IC) chip including an oscillation circuit and the like is accommodated in a second recess thereof. On the other hand, JP-A-2021-57755 discloses a wafer level packaging (WLP) type vibrator device including: a base having an integrated circuit disposed at one surface side thereof, the one surface side being an upper surface side; a lid bonded to the one surface side of the base; and a vibration element accommodated between the base and the lid.

JP-A-2021-57755 is an example of the related art.

It has been found that in such a WLP type vibrator device, when a stress is applied to the integrated circuit disposed at the one surface side that is the upper surface side of the base, circuit characteristics of the integrated circuit may be affected. For example, in order to bond the base and the lid, it is necessary to apply a pressure so as to have the lid and the base sandwiched. A stress generated in the base at this time affects the circuit characteristics of the integrated circuit formed at the one surface side of the base, and characteristics of the vibrator device may deteriorate.

SUMMARY

An aspect of the disclosure relates to a vibrator device including: a base including a semiconductor substrate that has a first surface and a second surface in a front and back relationship with the first surface and that has an integrated circuit disposed at the first surface; a vibration element electrically coupled to the integrated circuit; and a lid provided with a recess for accommodating the vibration element, including a side wall around the recess, and having an end surface of the side wall bonded to the first surface at a bonding portion. The integrated circuit includes a first circuit, the first circuit includes a first circuit element disposed in a first region of the first surface, the first region overlapping the bonding portion in a plan view orthogonal to the first surface, the first circuit element is a passive element or a transistor, and $\theta<90°$ is satisfied, $\theta$ being an angle formed by the first surface and an inner side surface of the side wall.

DESCRIPTION OF EMBODIMENTS

Figure 1:
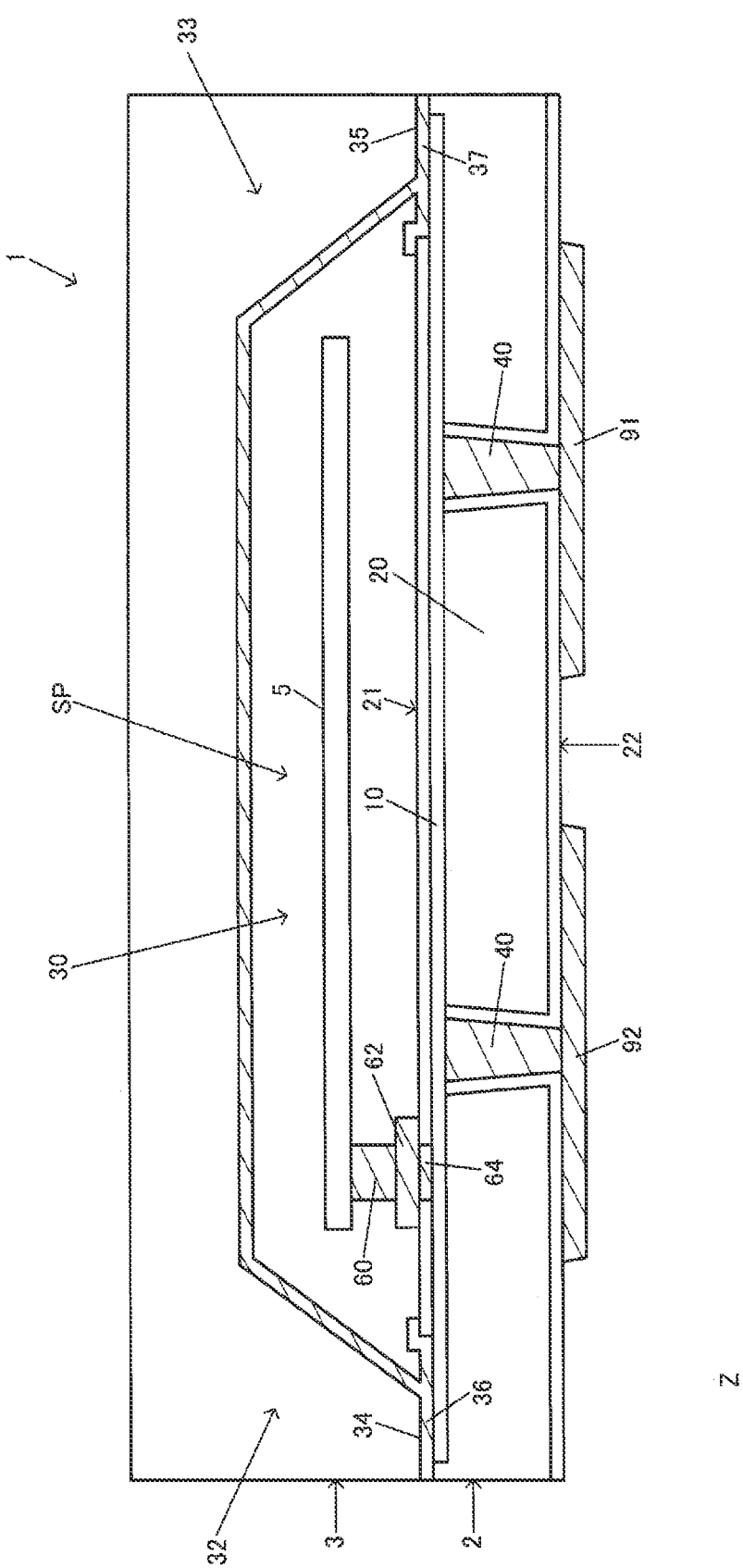
FIG. 1 is a cross-sectional view illustrating a configuration example of a vibrator device according to an embodiment.

Hereinafter, an embodiment will be described. The embodiment to be described below does not unduly limit the scope of the claims. Further, not all configurations described in the embodiment are necessarily essential components. In the following drawings, some components may be omitted for convenience of description. In the drawings, for easy understanding, a dimensional ratio of the components is different from an actual dimensional ratio thereof.

1. Vibrator Device

FIG. 1 is a cross-sectional view illustrating a configuration example of a vibrator device 1 according to the embodiment. As illustrated in FIG. 1, the vibrator device 1 according to the embodiment includes a base 2, a lid 3, and a vibration element 5. The vibrator device 1 may include external coupling terminals 91 and 92. In the drawings described in the embodiment, an X-axis, a Y-axis, and a Z-axis are illustrated as three axes orthogonal to one another. A direction along the X-axis is referred to as an X-axis direction or a first direction DR1, a direction along the Y-axis is referred to as a Y-axis direction or a second direction DR2, and a direction along the Z-axis is referred to as a Z-axis direction or a third direction DR3. In each axial direction, a tip end side of an arrow is referred to as a "plus side", and a base end side is referred to as a "minus side". A plus side in the Z-axis direction is referred to as "upper", and a minus side in the Z-axis direction is referred to as "lower". For example, the Z-axis direction is along a vertical direction, and an XY plane is along a horizontal plane. FIG. 1 is a cross-sectional view of the vibrator device 1 as viewed in the second direction DR2 that is the Y-axis direction.

The vibrator device 1 is, for example, an oscillator. Specifically, the vibrator device 1 is, for example, an oscillator such as a temperature compensated crystal oscillator (TCXO), an oven controlled crystal oscillator (OCXO), a voltage-controlled crystal oscillator (VCXO), a simple packaged crystal oscillator (SPXO) as a crystal oscillator having no temperature compensation function, a surface acoustic wave (SAW) oscillator, a voltage-controlled SAW oscillator, or a micro electro mechanical system (MEMS) oscillator. The MEMS oscillator can be implemented by a vibration element of MEMS in which a piezoelectric film and an electrode are disposed at a substrate such as a silicon substrate. The vibrator device 1 may be an inertial sensor such as an acceleration sensor or an angular velocity sensor, a force sensor such as an inclination sensor, or the like.

The base 2 includes a semiconductor substrate 20. The semiconductor substrate 20 is, for example, a silicon substrate. The semiconductor substrate 20 has a first surface 21 and a second surface 22 having a front and back relationship with the first surface 21. The first surface 21 is, for example, an upper surface of the semiconductor substrate 20, and the second surface 22 is, for example, a lower surface of the semiconductor substrate 20. The first surface 21 and the second surface 22 of the semiconductor substrate 20 are also a first surface and a second surface of the base 2. The first surface 21 and the second surface 22 of the semiconductor substrate 20 are surfaces along the XY plane and are surfaces orthogonal to the Z-axis. That is, the first surface 21 and the second surface 22 are surfaces along the first direction DR1 and the second direction DR2, and are surfaces orthogonal to the third direction DR3. Note that "being orthogonal" includes not only a case of intersecting at 90° but also a case of intersecting at an angle slightly deviated from 90°.

The base 2 includes an integrated circuit 10. The integrated circuit 10, which is a semiconductor circuit, is formed at the first surface 21 of the semiconductor substrate 20. The integrated circuit 10 includes a plurality of circuit elements. The circuit element is, for example, an active element such as a transistor or a diode, or a passive element such as a capacitive element, a resistive element, or an inductor element. The transistor is a CMOS transistor, a bipolar transistor or the like. Specifically, the integrated circuit 10 includes a plurality of circuit blocks each including a plurality of circuit elements. A first circuit and a second circuit of the integrated circuit 10 are one of the circuit blocks. The integrated circuit 10 includes a diffusion region that is an impurity region formed by doping the semiconductor substrate 20 with an impurity, and a wiring region in which a metal layer and an insulating layer are stacked. A source region and a drain region of a transistor that is a circuit element of the integrated circuit 10 are formed in the diffusion region, and a wiring that couples the circuit elements is formed in the wiring region. The coupling in the embodiment is electrical coupling. The electrical coupling is coupling in which an electrical signal can be transmitted and information can be transmitted through the electrical signal. The electrical coupling may be coupling via a passive element or the like.

The base 2 includes a through electrode 40. The through electrode 40 is made of a conductive material penetrating the semiconductor substrate 20. For example, a through hole is formed in the semiconductor substrate 20, and the through electrode 40 is formed by filling the through hole with a conductive material. The conductive material may be a metal such as copper or conductive polysilicon. The conductive polysilicon refers to polysilicon doped with an impurity of phosphorus (P), boron (B), or arsenic (As) to provide conductivity. When polysilicon is used as the conductive material, the through electrode 40 having sufficient resistance to heat received in a forming process of the integrated circuit 10 can be implemented.

The through electrode 40 has one end electrically coupled to the integrated circuit 10 and the other end electrically coupled to the external coupling terminals 91 and 92. Specifically, the one end of the through electrode 40 is coupled to a circuit element of the integrated circuit 10 via a contact pad formed at the integrated circuit 10. The external coupling terminals 91 and 92 are provided at the second surface 22 side of the semiconductor substrate 20 via an insulating layer or the like. In this way, the integrated circuit 10 and the external coupling terminals 91 and 92 can be electrically coupled via the through electrode 40. The external coupling terminals 91 and 92 of the vibrator device 1 are coupled to a terminal or wiring of a circuit board or the like on which the vibrator device 1 is mounted, so that the vibrator device 1 can be incorporated into an electronic apparatus.

The lid 3 is bonded to the base 2 at bonding portions 36 and 37. The base 2 is implemented by a semiconductor substrate such as a silicon substrate. Specifically, the lid 3 is provided with a recess 30 that accommodates the vibration element 5, and includes side walls 32 and 33 around the recess 30. The side walls 32 and 33 are, for example, walls provided around the recess 30 in a plan view viewed in the third direction DR3 that is the Z-axis direction. End surfaces 34 and 35 of the side walls 32 and 33 are bonded to the first surface 21 of the base 2 at the bonding portions 36 and 37. The bonding portions 36 and 37 are implemented by a metal film of gold, copper or the like. The base 2 and the lid 3 are bonded to each other by applying a pressure to the bonding portions 36 and 37, which are metal films of gold or the like, by a load described later. A method of bonding the base 2 and the lid 3 by the bonding portions 36 and 37 is not limited thereto, and various bonding methods such as direct bonding are conceivable. An airtight accommodation space SP is defined by the base 2 and the lid 3 as a lid body, and the vibration element 5 is accommodated in the accommodation space SP. The accommodation space SP corresponds to the recess 30 of the lid 3. The accommodation space SP is hermetically sealed, and the accommodation space SP is, for example, in a depressurized state. Accordingly, the vibration element 5 can be stably driven. A state of the accommodation space SP is not limited to the depressurized state, and for example, the accommodating space SP may have an inert gas atmosphere.

In the embodiment, the base 2 and the lid 3 are both implemented by a semiconductor substrate such as a silicon substrate. Accordingly, thermal expansion coefficients of the base 2 and the lid 3 can be made equal to each other, generation of a thermal stress due to thermal expansion can be prevented, and the vibrator device 1 having excellent characteristics can be implemented. In addition, since the vibrator device 1 can be formed by a semiconductor process, the vibrator device 1 can be manufactured accurately and efficiently, and a reduction in size of the vibrator device 1 can be achieved. The semiconductor substrate constituting the base 2 and the lid 3 is not limited to a silicon substrate, and may be a semiconductor substrate of Ge, GaP, GaAs, InP, or the like.

The vibration element 5 is an element that generates mechanical vibration in response to an electrical signal. The vibration element 5 is electrically coupled to the integrated circuit 10. For example, the vibration element 5 is disposed at the first surface 21 side of the semiconductor substrate 20. Specifically, the vibration element 5 is disposed at a position spaced apart from the first surface 21 of the semiconductor substrate 20 by a given clearance. More specifically, the vibration element 5 is fixed at the first surface 21 of the semiconductor substrate 20 via, for example, a conductive bonding portion 60.

For example, the vibration element 5 includes a vibration substrate and an electrode disposed at a front surface of the vibration substrate. The vibration substrate has a thickness-shear vibration mode, and is formed of, for example, an AT-cut quartz crystal substrate. Since the AT-cut quartz crystal substrate has frequency-temperature characteristics showing a cubic curve, the vibration element 5 presents excellent temperature characteristics. In addition, the electrode includes an excitation electrode disposed at an upper surface of the vibration substrate and an excitation electrode disposed at a lower surface so as to face the excitation electrode.

The configuration of the vibration element 5 is not limited to the above configuration. For example, the vibration element 5 may be of a mesa type in which a vibration region sandwiched between the two excitation electrodes protrudes from a periphery thereof, or may be of an inverted mesa type in which the vibration region is recessed from the periphery thereof. In addition, bevel machining in which a periphery of the vibration substrate is ground or convex machining in which the upper surface and the lower surface are made into convex surfaces may be performed. The vibration element 5 is not limited to a vibration element that vibrates in the thickness-shear vibration mode. For example, the vibration element 5 may be a tuning fork type vibration element in which a plurality of vibrating arms perform flexural vibration in an in-plane direction, a tuning fork type vibration element in which a plurality of vibrating arms perform flexural vibration in an out-of-plane direction, a gyro sensor element, or an acceleration sensor element. The gyro sensor element includes a driving arm performing drive vibration and a detection arm performing detection vibration, and detects an angular velocity. The acceleration sensor element includes a detection unit configured to detect an acceleration. The vibration substrate is not limited to the one formed of the AT-cut quartz crystal substrate, and may be formed of a quartz crystal substrate other than the AT-cut quartz crystal substrate, for example, an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate. Although the vibration substrate is made of quartz crystal in the embodiment, the invention is not limited thereto. For example, the vibration substrate may be made of a piezoelectric single crystal body of lithium niobate, lithium tantalate, lithium tetraborate, potassium niobate, or gallium phosphate, or may be made of a piezoelectric single crystal body other than those described above. The vibration element 5 is not limited to a piezoelectric drive type vibration element, and may be an electrostatic drive type vibration element using an electrostatic force.

The vibration element 5 is electrically coupled to the integrated circuit 10. For example, a mount electrode 62 made of metal or the like is provided at the first surface 21 side of the semiconductor substrate 20, and the conductive bonding portion 60 is provided on the mount electrode 62. Accordingly, the vibration element 5 is electrically coupled to the integrated circuit 10 via the bonding portion 60 and the mount electrode 62. For example, an insulating layer is formed at the first surface 21 of the semiconductor substrate 20, and the mount electrode 62 is formed on the insulating layer. The mount electrode 62 is coupled to a circuit element of the integrated circuit 10 via a wiring 64 provided in the insulating layer and a contact pad (not shown) of the integrated circuit 10. The conductive bonding portion 60 is implemented by a bump or the like. The bump is a conductive bonding member, and is specifically, a gold bump, a silver bump, a copper bump, a solder bump, a resin core bump, or the like. As the conductive bonding portion 60, a conductive adhesive obtained by dispersing a conductive filler such as a silver filler in an adhesive such as a polyimide-based adhesive, an epoxy-based adhesive, a silicone-based adhesive, or an acrylic adhesive may be used.

As described above, the vibrator device 1 of the embodiment includes the base 2 including the semiconductor substrate 20, and the vibration element 5 electrically coupled to the integrated circuit 10. The semiconductor substrate 20 has the first surface 21 and the second surface 22, and the integrated circuit 10 is disposed, for example, at the first surface 21 of the semiconductor substrate 20. In addition, the vibrator device 1 includes the lid 3 that includes the side walls 32 and 33 around the recess 30 accommodating the vibration element 5, and the end surfaces 34 and 35 of the side walls 32 and 33 are bonded to the first surface 21 at the bonding portions 36 and 37. In FIG. 1, since the integrated circuit 10 is formed at the first surface 21 of the semiconductor substrate 20, which is the lid 3 side, the integrated circuit 10 can be disposed in the accommodation space SP, and the integrated circuit 10 can be protected from an external environment.

Figure 2:
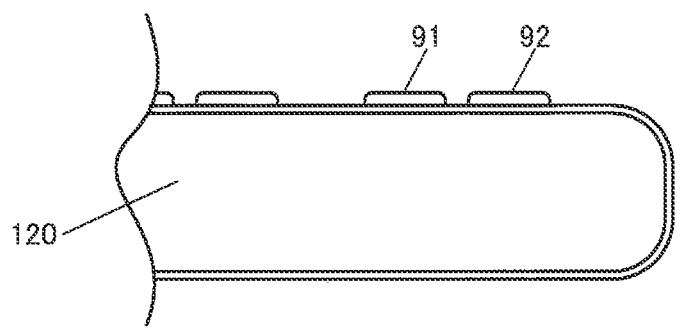
FIG. 2 is a diagram illustrating an example of a manufacturing process of the vibrator device.
Figure 3:
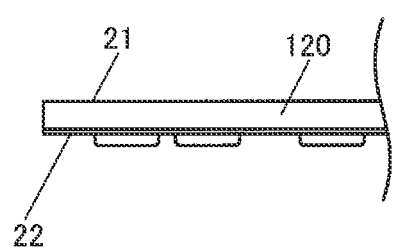
FIG. 3 is a diagram illustrating an example of the manufacturing process of the vibrator device.
Figure 4:
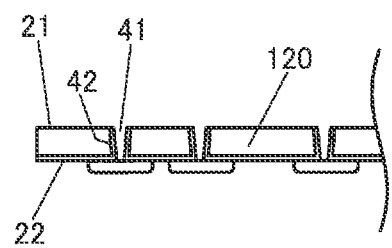
FIG. 4 is a diagram illustrating an example of the manufacturing process of the vibrator device.
Figure 5:
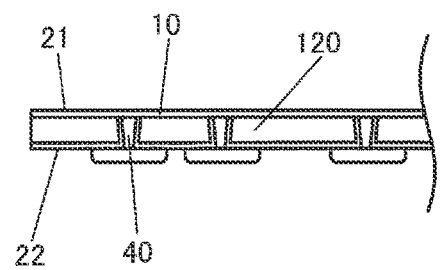
FIG. 5 is a diagram illustrating an example of the manufacturing process of the vibrator device.

Next, an example of a manufacturing flow of the vibrator device 1 will be described with reference to FIGS. 2 to 8. First, as illustrated in FIG. 2, external coupling terminals 91 and 92 are formed on a first semiconductor wafer 120. Then, as illustrated in FIG. 3, the first semiconductor wafer 120 is ground and polished from the first surface 21 side to a thickness of, for example, about 60 μm to 80 μm. Next, as illustrated in FIG. 4, the through hole 41 such as a through silicon via (TSV) is formed in the first semiconductor wafer 120, and an insulating film 42 of silicon oxide ($SiO_2$) or the like is formed at an inner surface of the through hole 41. As illustrated in FIG. 5, the through electrode 40 is formed in the through hole 41, and the integrated circuit 10 is formed at the first surface 21 of the semiconductor substrate 20.

Figure 6:
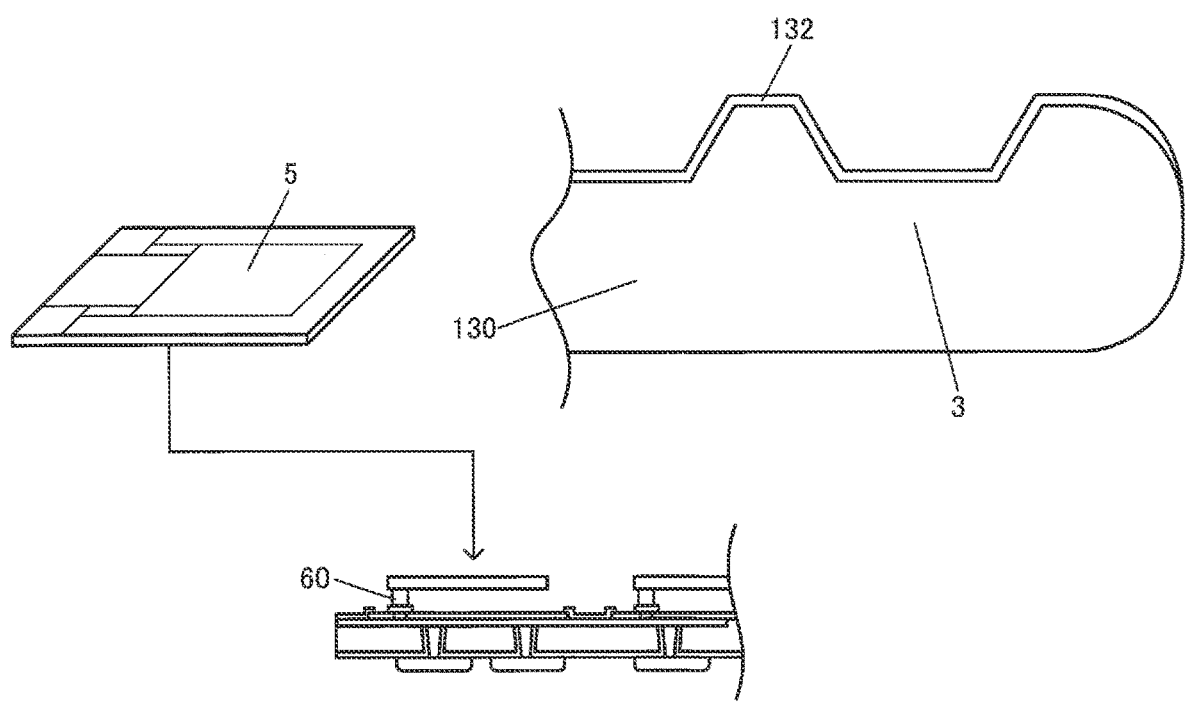
FIG. 6 is a diagram illustrating an example of the manufacturing process of the vibrator device.

Next, as illustrated in FIG. 6, the vibration element 5 is coupled to the bonding portion 60. Accordingly, the vibration element 5 and the integrated circuit 10 are electrically coupled. Further, a second semiconductor wafer 130 for forming the lid 3 is prepared, and a metal film 132, which is a bonding film made of a material such as gold, is formed at a surface of the second semiconductor wafer 130 on a recess side.

Figure 7:
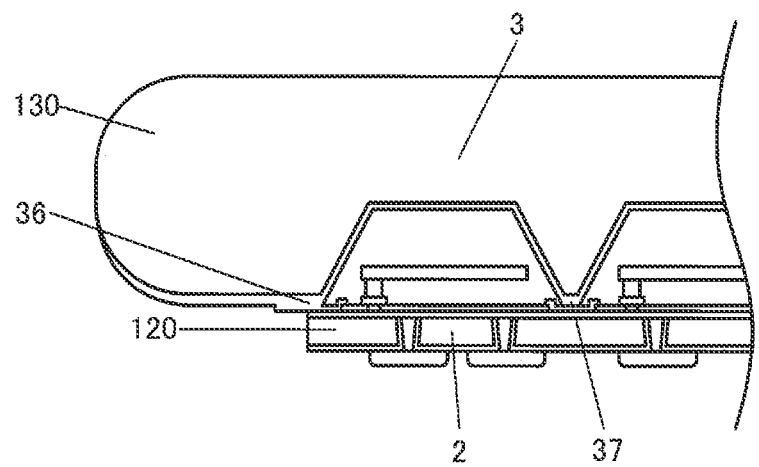
FIG. 7 is a diagram illustrating an example of the manufacturing process of the vibrator device.

Next, as illustrated in FIG. 7, the second semiconductor wafer 130 forming the lid 3 is bonded, via the bonding portions 36 and 37 by stress application, to the first semiconductor wafer 120 forming the base 2. This bonding is performed, for example, under a vacuum atmosphere. The bonding portions 36 and 37 are bonding portions formed of the metal film 132 made of gold or the like illustrated in FIG. 6. A force applied by a load when bonding the second semiconductor wafer 130 to the first semiconductor wafer 120 is, for example, 10 ton or more, and is, for example, about 20 ton.

Figure 8:
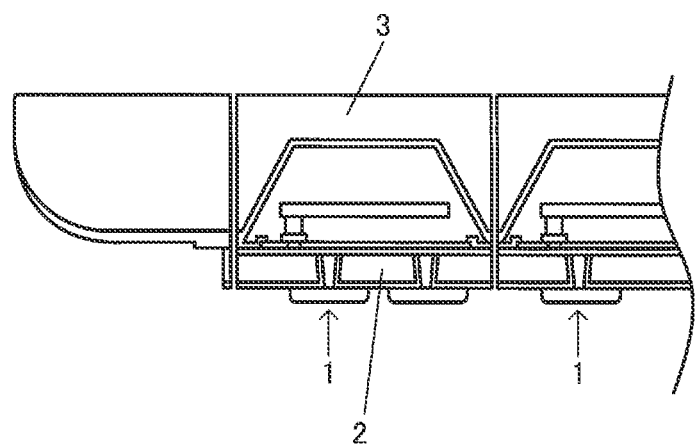
FIG. 8 is a diagram illustrating an example of the manufacturing process of the vibrator device.

Next, as illustrated in FIG. 8, after grinding, a dicing saw or the like is used to perform dicing to separate the vibrator device 1. Thus, a large number of vibrator devices 1 can be separated from the first semiconductor wafer 120 and the second semiconductor wafer 130. A length of a long side of the vibrator device 1 in a plan view is about 1.0 mm to 1.2 mm as an example, and a length of a short side is about 0.8 mm to 1.0 mm as an example. A width of a dicing blade is, for example, about 20 μm, and a width of the bonding portions 36 and 37 of the vibrator device 1 is, for example, about 30 μm to 100 μm, and is, for example, about 60 μm.

2. Vibrator Device of WLP Type

In a vibrator device in the related art, an IC chip and a quartz crystal vibration element are built in a ceramic package. In contrast, in the vibrator device 1 of a WLP type illustrated in FIGS. 1 to 8, since the IC itself is packaged, an area of the integrated circuit 10 that is the IC can be maximized, and a small-sized and highly functional oscillator or the like can be implemented. For example, in the vibrator device of a ceramic package type, an area of the IC in a plan view is, for example, 50% to 60% or less of an area of the package of the vibrator device. In contrast, according to the vibrator device 1 of a WLP type, the area of the integrated circuit 10 can be made larger than, for example, 50% to 60% of an area of the base 2. Accordingly, it is possible to provide the integrated circuit 10 with a circuit for making the vibrator device 1 more highly functional.

However, in the vibrator device 1 of a WLP type, as illustrated in FIG. 7, when the first semiconductor wafer 120 forming the base 2 and the second semiconductor wafer 130 forming the lid 3 are bonded to each other by a load, a large stress is generated in the bonding portions 36 and 37, and this stress is also applied to the integrated circuit 10. In this case, circuit characteristics of the integrated circuit 10 may change due to a residual stress or the like.

For example, in the vibrator device disclosed in JP-A-2021-57755, a side wall is formed perpendicularly to a main surface of a semiconductor substrate at an angle of 90°. Accordingly, the accommodation space for the vibration element can be made wider and a size of the vibration element can be maximized, contributing to improvement of vibration characteristics of the vibration element. However, since a load in a vertical direction generated when a first semiconductor wafer forming the base and a second semiconductor wafer forming the lid are bonded to each other is vertically transmitted to a bonding portion, a large stress is easily generated in the vicinity of the bonding portion of the lid and the base. In order to achieve both size reduction and high functionality of the vibrator device, it is required to arrange the circuit elements of the integrated circuit in a wide range with a high degree of integration. Therefore, it is desirable to arrange circuit elements also in a region overlapping the bonding portion of the lid and the base in a plan view. However, when the circuit elements are arranged in the region overlapping the bonding portion, circuit characteristics of the circuit elements and a circuit including the circuit elements may deteriorate due to the stress caused by the load at the time of bonding, and thus there may be a restriction on a region where the circuit elements can be arranged.

Figure 9:
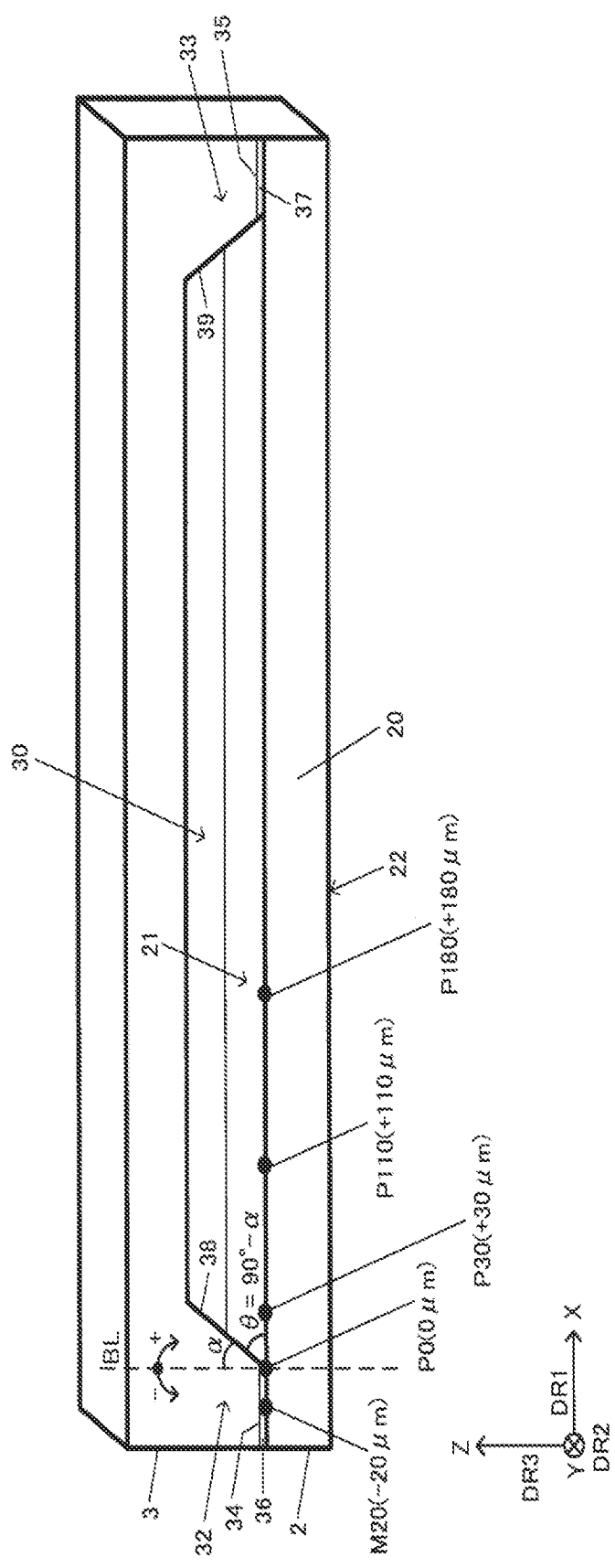
FIG. 9 is an explanatory diagram explaining an inclination of a side wall of a lid in the embodiment.

Therefore, in the embodiment, as illustrated in FIG. 9 and FIG. 1, inner side surfaces 38 and 39 of the side walls 32 and 33 of the lid 3 are inclined with respect to the first surface 21 of the semiconductor substrate 20 of the base 2. That is, the inner side surfaces 38 and 39 of the side walls 32 and 33 are not formed to be perpendicular to the first surface 21, but are formed to be inclined with respect to the first surface 21. As described, by inclining the inner side surface 38 and 39 of the side walls 32 and 33 of the lid 3, rigidity of the lid 3 can be enhanced, and a stress caused by a load when pressed in the vertical direction can be reduced. That is, since the inner side surfaces 38 and 39 of the side walls 32 and 33 of the lid 3 are inclined, a load generation direction and a stress generation direction when the lid 3 is pressed in the vertical direction are inclined, and the stress is dispersed in regions including an inner region of the bonding portions 36 and 37. Accordingly, a maximum value of the stress generated in the vicinity of the bonding portions 36 and 37 can be reduced, and a stress generated in an active surface of the integrated circuit 10 can be reduced. Since a large stress is less likely to be applied to the integrated circuit 10, a characteristics variation of the circuit element can be reduced, and the vibrator device 1 characteristic in high accuracy can be implemented. In addition, it is possible to reduce a region where the stress is large in the integrated circuit 10, and it is possible to enlarge an area of the integrated circuit 10 allowing mounting of the circuit elements. Accordingly, the small-sized and highly functional vibrator device 1 can be implemented.

Figure 10:
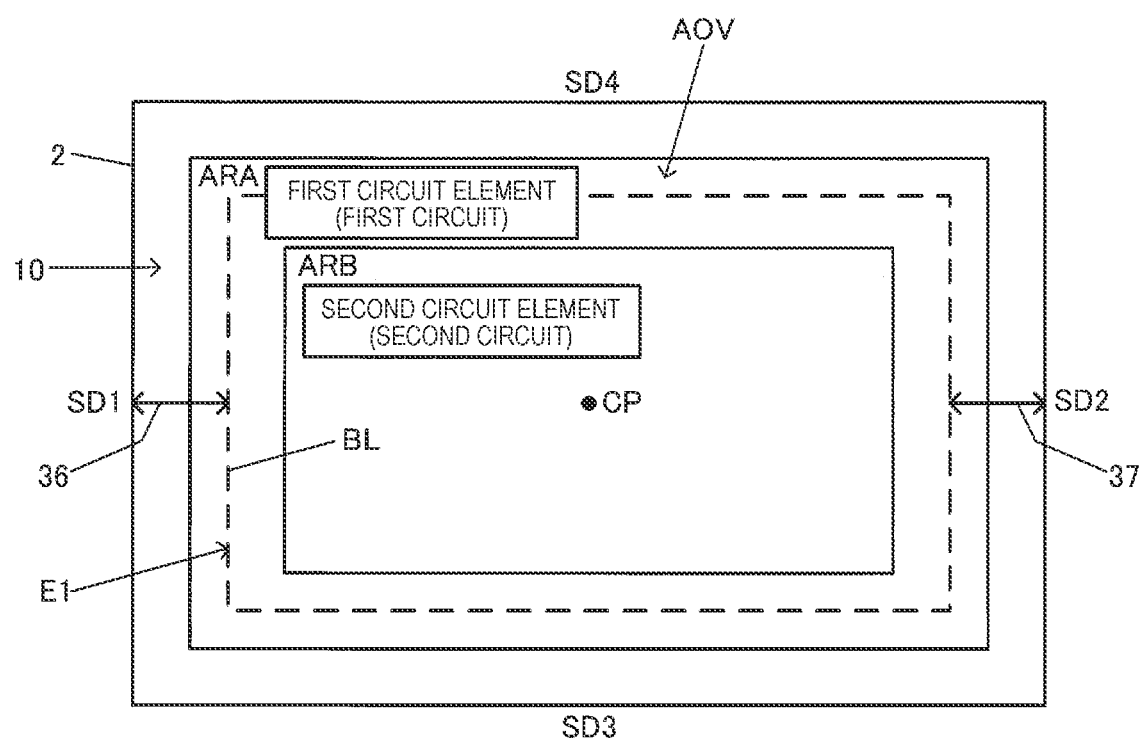
FIG. 10 is an explanatory diagram explaining arrangement of circuit elements and circuits in an integrated circuit.

FIG. 10 is an explanatory diagram explaining arrangement of circuit elements and circuits in an integrated circuit. As illustrated in FIG. 10, the base 2 has a first side SD1, a second side SD2 that is an opposite side of the first side SD1, a third side SD3, and a fourth side SD4 that is an opposite side of the third side SD3 in a plan view viewed in a direction orthogonal to the first surface 21. The base 2 has, for example, a rectangular shape in the plan view. In addition to an oblong shape, the rectangular shape also includes a square shape and a shape similar to a rectangular shape or a square shape. Examples of the shapes similar to a rectangular shape or a square shape include a quadrangle having an interior angle deviated from 90° and a quadrangle having chamfered or rounded corners. A direction from the first side SD1 toward the second side SD2 is defined as the first direction DR1, and a direction from the third side SD3 toward the fourth side SD4 is defined as the second direction DR2. The first direction DR1 is, for example, the X-axis direction, and the second direction DR2 is, for example, the Y-axis direction. A plan view direction that is a direction orthogonal to the first surface 21 is a direction orthogonal to the first direction DR1 and the second direction DR2, and is, for example, the Z-axis direction.

The integrated circuit 10 includes a first circuit and a second circuit. Each of the first circuit and the second circuit is a circuit including at least one of an active element and a passive element, and is, for example, a circuit block or a macro block including a plurality of circuit elements in order to implement a specific function. Here, the first circuit includes, for example, a first circuit element, and the second circuit includes, for example, a second circuit element. As illustrated in FIG. 10, among a first region ARA and a second region ARB of the first surface 21 of the base 2, the first circuit element of the first circuit of the integrated circuit 10 is disposed in the first region ARA. The first surface 21 of the base 2 is also the first surface of the semiconductor substrate 20. Specifically, the first region ARA is a region overlapping the bonding portions 36 and 37 in the plan view orthogonal to the first surface 21. On the other hand, the second region ARB is a region on an inner side of the first region ARA. For example, the second region ARB is a region including a center point CP of the base 2, and the first region ARA is a region surrounding the second region ARB in the plan view orthogonal to the first surface 21. For example, a region on the inner side of the first region ARA excluding the second region ARB is the first region ARA. The first circuit element of the first circuit of the integrated circuit 10 is disposed in the first region ARA, and the second circuit element of the second circuit of the integrated circuit 10 is disposed in the second region ARB on the inner side of the first region ARA. The first region ARA and the second region ARB are regions defined to set an arrangement region of the circuit element according to stress distribution, and it does not mean that such regions actually exist in the integrated circuit 10. The arrangement region of the integrated circuit 10 in the embodiment is, for example, a region on an inner side of a guard ring, and does not include a scribe region on an outer side of the guard ring.

As described, the first region ARA is a region overlapping the bonding portions 36 and 37 in a plan view, for example. The plan view is a plan view in the direction orthogonal to the first direction DR1 and the second direction DR2, and is a plan view in the third direction DR3. A region between a dotted line indicated by E1 in FIG. 10 and ends of the base 2 corresponds to a region of the bonding portions 36 and 37 in the plan view. The first region ARA overlaps the bonding portions 36 and 37 in a region AOV in the plan view. In this way, for example, the first circuit element in the first region ARA can be disposed also in a region corresponding to the bonding portions 36 and 37 in the plan view. Accordingly, the first circuit element can be disposed by effectively utilizing the region corresponding to the bonding portions 36 and 37, and an arrangement area of the integrated circuit 10 can be enlarged.

Figure 11:
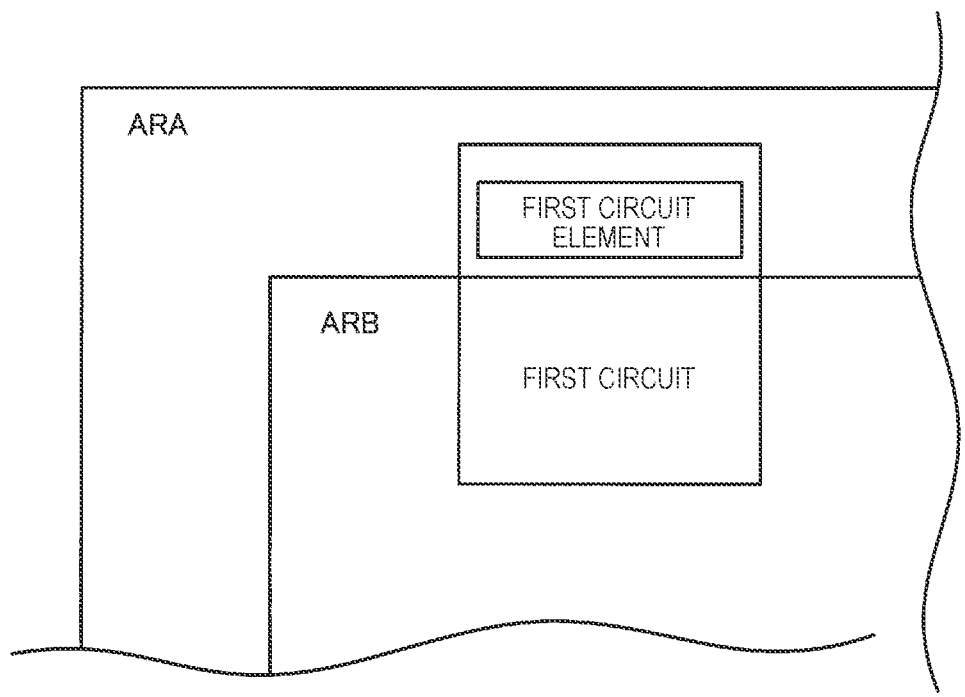
FIG. 11 is an explanatory diagram explaining arrangement of a first circuit element and a first circuit.
Figure 12:
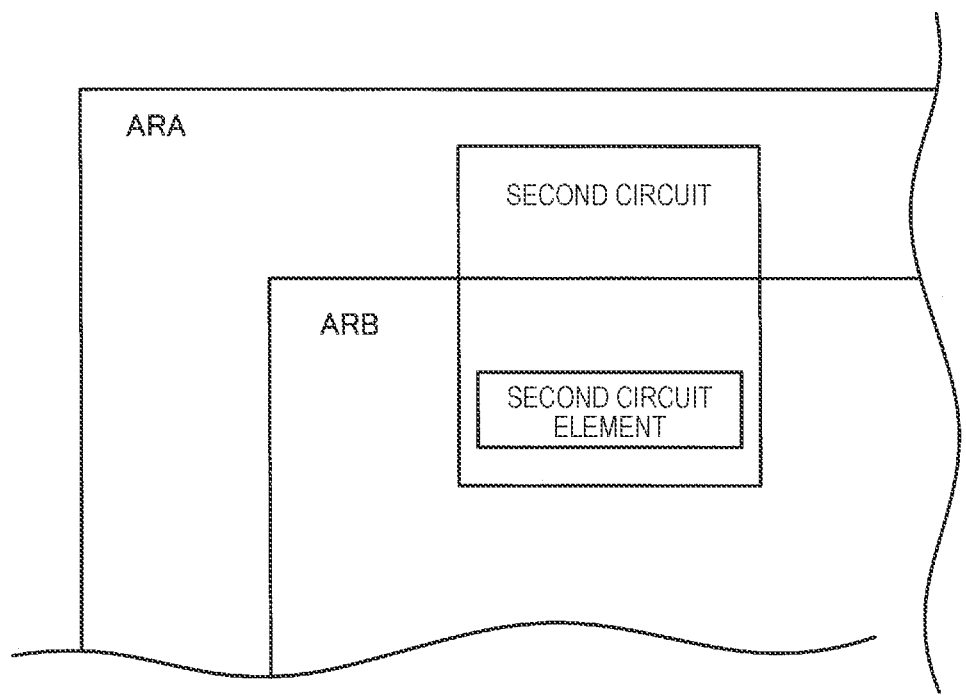
FIG. 12 is an explanatory diagram explaining arrangement of a second circuit element and a second circuit

Here, as illustrated in FIG. 11, as long as the first circuit element of the first circuit is disposed in the first region ARA, for example, another portion of the first circuit may be disposed in the second region ARB. That is, it is sufficient that at least the first circuit element of the first circuit is disposed in the first region ARA. As illustrated in FIG. 12, as long as the second circuit element of the second circuit is disposed in the second region ARB, for example, another portion of the second circuit may be disposed in the first region ARA. That is, it is sufficient that at least the second circuit element of the second circuit is disposed in the second region ARB.

The first circuit element disposed in the first region ARA is a passive element or a transistor. The passive element is, for example, a capacitive element, a resistive element, or an inductor element, and the transistor is, for example, a CMOS transistor or a bipolar transistor. In the embodiment, as illustrated in FIG. 9, a relationship of $\theta<90°$ is satisfied, $\theta$ being an angle formed by the first surface 21 of the base 2, which is the first surface of the semiconductor substrate 20, and the inner side surface 38 of the side wall 32 of the lid 3.

An angle formed by the first surface 21 and the inner side surface 39 of the side wall 33 of the lid 3 also satisfies the relationship of $\theta<90°$. In the following description, for simplification, the side wall 32 and the inner side surface 38 of the lid 3 will be mainly described as an example, and a detailed description regarding the side wall 33 and inner side surface 39 will be omitted. For example, in the following description, the side wall 32 is described as a representative of the side wall 32 and the side wall 33, and the inner side surface 38 is described as a representative of the inner side surface 38 and the inner side surface 39.

For example, in FIG. 9, a bonding boundary of the bonding portion 36 is defined as BL. The bonding boundary BL is an inner boundary of the bonding portion 36 and is a boundary along the direction orthogonal to the first surface 21. That is, the bonding boundary BL is a boundary along the third direction DR3 orthogonal to the first direction DR1 and the second direction DR2, for example, a boundary along the Z-axis direction. The inner side of the bonding portion 36 indicates a direction from the bonding portion 36 toward a central portion of the base 2. In this case, an inclination angle $\alpha$ of the side wall 32 corresponds to an angle formed by a direction along the inner side surface 38 of the side wall 32 and the bonding boundary BL. The angle $\theta$ formed by the first surface 21 and the inner side surface 38 of the side wall 32 can be expressed as $\theta=90°-\alpha$. For example, $\theta<90°$ corresponds to the inclination angle $\alpha>0$, and means that the inner side surface 38 of the side wall 32 is inclined in a positive direction from the direction orthogonal to the first surface 21. For example, when the inner side surface 38 is inclined in an inward direction that is a direction from the bonding boundary BL toward the central portion of the base 2, the inclination of the inner side surface 38 is an inclination in a positive direction, and the inclination angle $\alpha$ has a positive value. When the inner side surface 38 is inclined in the outward direction of the base 2 from the bonding boundary BL, the inclination of the inner side surface 38 is an inclination in the negative direction, and the inclination angle $\alpha$ has a negative value. The inclination in the positive direction presents, for example, a forward taper that is a taper in a forward direction, and the inclination in the negative direction presents, for example, a reverse taper that is a taper in a reverse direction.

As described above, in the embodiment, the inner side surface 38 of the side wall 32 of the lid 3 is inclined such that $\theta<90°$. As described, by inclining the inner side surface 38 of the side wall 32, a stress caused by a load when bonding the first semiconductor wafer 120 and the second semiconductor wafer 130 illustrated in FIG. 7 can be dispersed in an entire region including an inner region of the bonding portion 36. Accordingly, it is possible to reduce a stress in a region where the stress has a maximum value. For example, by dispersing the stress caused by the load in an inward direction or the like from the bonding boundary BL of the bonding portion 36, a stress in a region in the vicinity of the bonding portion 36 where the stress has the maximum value is reduced.

As illustrated in FIG. 10, the first region ARA in which the first circuit element is disposed is a region overlapping the bonding portion 36 in the plan view, and is a region in the vicinity of the bonding portion 36. Therefore, in the first region ARA, there is a region in which the stress is larger than in the other regions and has the maximum value. Accordingly, by inclining the inner side surface 38 of the side wall 32 of the lid 3 such that θ<90°, a stress generated in the first region ARA can be dispersed to a region on the inner side of the bonding portion 36, and thus a stress applied to the first circuit element disposed in the first region ARA can be reduced. In this way, it is possible to prevent deterioration of a circuit characteristic of the first circuit element or deterioration of a circuit characteristic of the first circuit including the first circuit element due to the stress caused by the load when bonding the semiconductor wafers. Accordingly, it is possible to implement the small-sized and highly functional vibrator device 1, and it is possible to effectively prevent the deterioration of the characteristics of the vibrator device 1 caused by the stress.

Figure 13:
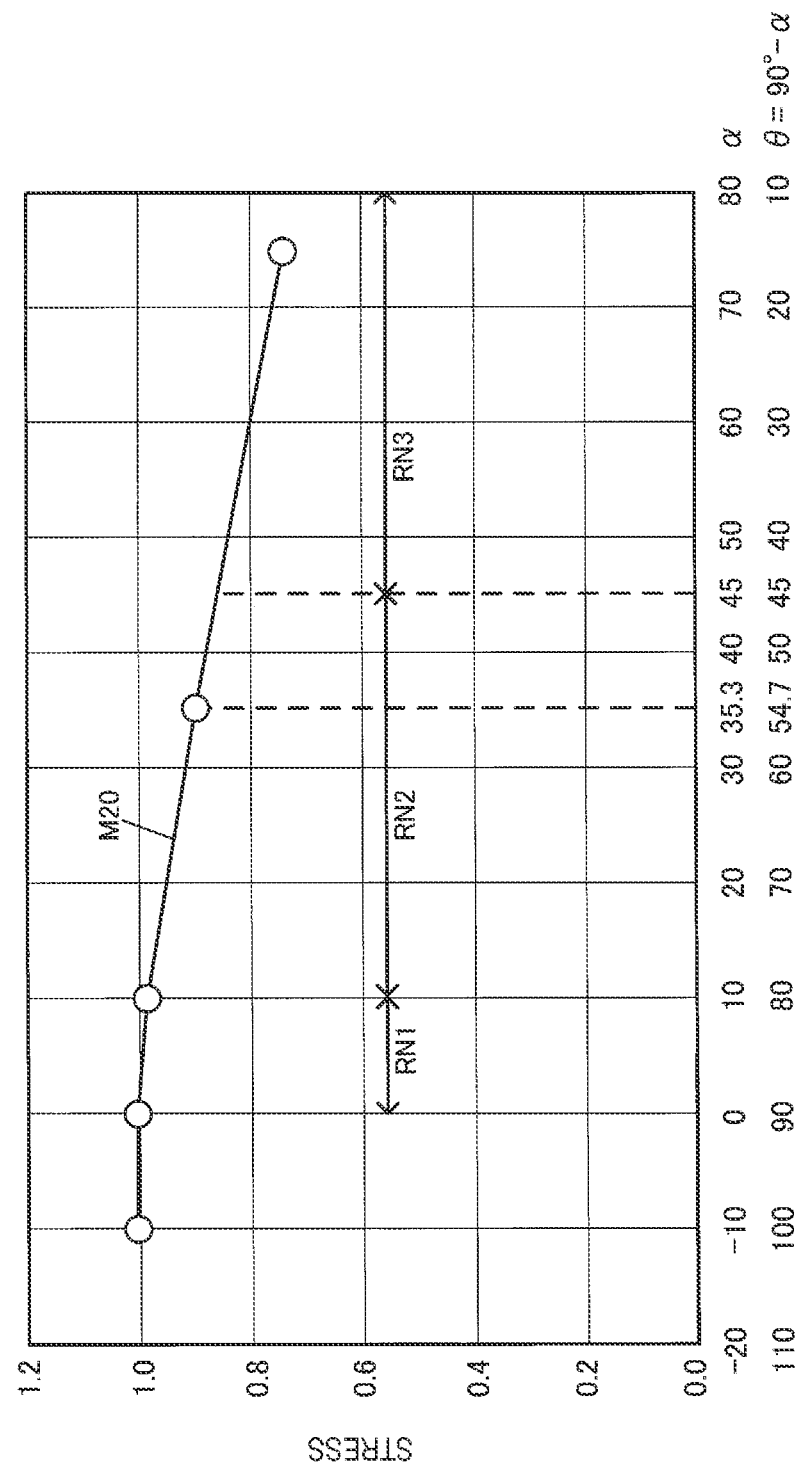
FIG. 13 is an explanatory graph explaining a relationship between an inclination angle $\alpha$ and an angle $\theta$ and a stress.

Next, a relationship between the inclination angle α and the angle θ of the inner side surface 38 of the side wall 32 and the stress will be described in detail. FIG. 13 is a graph illustrating a relationship between the inclination angle α and the angle θ and a stress at a position M20 in FIG. 9. The stress represented by a vertical axis indicates a normalized stress value. The position M20 is a position on an outer side of the bonding boundary BL by a distance of 20 µm. For example, when the first region ARA in FIG. 10 is expanded and a boundary of the first region ARA on an outer side is brought close to the ends of the base 2, the position M20 is located in the first region ARA. In FIG. 9, "+" is assigned to a distance from the bonding boundary BL to an inner position, and "−" is assigned to a distance from the boding boundary BL to an outer position.

As illustrated in FIG. 13, in the embodiment, the inner side surface 38 of the side wall 32 is inclined and the inclination angle thereof satisfies α>0°. That is, by setting the angle θ=90°−α, which is formed by the inner side surface 38 and the first surface 21, to θ<90°, the stress at the position M20 in the vicinity of the bonding portion 36 is reduced. For example, in ranges RN1, RN2 and RN3 in FIG. 13 where the angle θ<90°, the stress at the position M20 is reduced as compared to a case where θ=90°. Accordingly, it is possible to effectively prevent the deterioration, caused by the stress, in the circuit characteristic of the first circuit element or the first circuit including the first circuit element disposed in the first region ARA that is a region in the vicinity of the bonding portion 36.

That is, in a case where the side wall 32 is formed to be perpendicular to the first surface 21 at an angle of θ=90°, when a load pressing the lid 3 in the vertical direction is applied as illustrated in FIG. 7, a stress caused by the load in the vertical direction is not dispersed, and thus a stress at the position M20 in the region in the vicinity of the bonding portion 36 is large. In contrast, by setting θ<90° to incline the inner side surface 38 of the side wall 32, the stress caused by the load in the vertical direction is dispersed. Accordingly, a maximum value of the stress at the position M20 in the region in the vicinity of the bonding portion 36 can be reduced, and the stress applied to the first circuit element in the first region ARA can be reduced.

Figure 14:
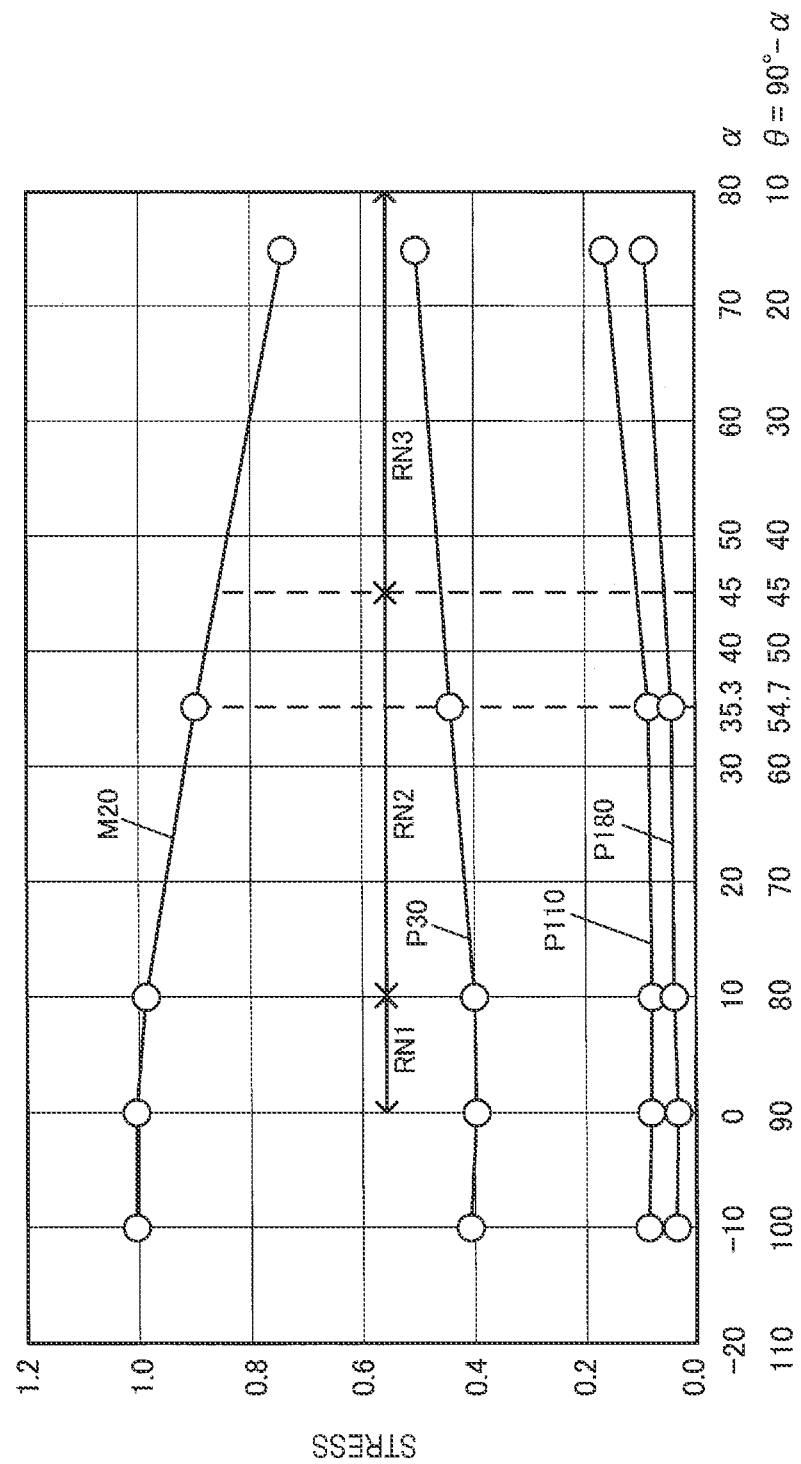
FIG. 14 is an explanatory graph explaining a relationship between an inclination angle $\alpha$ and an angle $\theta$ and a stress.

FIG. 14 illustrates a relationship between the inclination angle α and the angle θ and a stress at a position P30, a position P110, and a position P180 in FIG. 9. The position P30, the position P110, and the position P180 are located on the inner side of the bonding boundary BL by distances of 30 µm, 110 µm, and 180 µm, respectively. The stress represented by a vertical axis in FIG. 14 is normalized so that a value of a stress at a position where the stress is maximum is 1.0.

As illustrated in FIG. 14, at the position P30, the position P110 and the position P180 on the inner side of the bonding boundary BL, when the inclination is provided such that θ<90°, the stress increases. That is, when θ<90°, the stress caused by the load in the vertical direction is dispersed, and thus the stresses at the position P30, the position P110 and the position P180 on the inner side of the bonding portion 36 increase. In this case, an increase amount of the stress when θ<90° increases as the position is farther away from the bonding boundary BL. By setting θ<90° in this way, when the stress caused by the load in the vertical direction is dispersed and the stresses at the position P30, the position P110 and the position P180 on the inner side of the bonding boundary BL increase, the stress at the position M20 on the outer side of the bonding boundary BL decreases by an amount corresponding to the increase in the stress. For example, the position M20 is a position where the stress has the maximum value with respect to the other positions P30, P110 and P180, and the stress at the position M20 decreases when θ<90°. Accordingly, the stress applied to the first circuit element disposed in the first region ARA is reduced.

As described above, in the embodiment, in the vibrator device 1 including the base 2 having the integrated circuit 10 disposed at the first surface 21, the vibration element 5 coupled to the integrated circuit 10, and the lid 3 bonded to the base 2, the first circuit element of the first circuit of the integrated circuit 10 is disposed in the first region ARA overlapping the bonding portion 36 in the plan view as illustrated in FIG. 10. The inner side surface 38 of the side wall 32 of the lid 3 is inclined such that θ<90°, θ being the angle formed by the first surface 21 of the base 2 and the inner side surface 38 of the side wall 32.

By inclining the inner side surface 38 of the side wall 32, a load generation direction and a stress generation direction when the lid 3 is pressed in the vertical direction can be inclined. Accordingly, the maximum value of the stress generated in the region in the vicinity of the bonding portion 36 can be reduced, a maximum value of the stress generated in the active surface of the integrated circuit 10 can be reduced, and the vibrator device 1 with high accuracy and a small characteristics variation can be implemented. In addition, a region where a stress in the integrated circuit 10 is large can be reduced, and the area of the integrated circuit 10 allowing mounting of the circuit elements can be increased. Accordingly, the small-sized and highly functional vibrator device 1 can be implemented. Further, by enhancing resistance to the load at the time of bonding, it is possible to improve strength against a load for holding a product of the vibrator device 1 when mounting the product. Therefore, it is possible to provide the vibrator device 1 that is small-sized, highly functional and durable.

In the embodiment, a relational expression of θ<80° may be satisfied, θ being the angle formed by the first surface 21 and the inner side surface 38. In this way, the stress at the position M20 in the vicinity of the bonding portion 36 is a stress in the ranges RN2 and RN3 in FIG. 13, and a stress value thereof can be further reduced compared to that of a stress in the range RN1. Accordingly, the stress applied to the first circuit element disposed in the first region ARA in the vicinity of the bonding portion 36 can be further reduced, and the deterioration in circuit characteristics of the first circuit element and the first circuit caused by stress application can be further prevented.

In the embodiment, a relational expression of θ>45° may be preferably satisfied, θ being the angle formed by the first surface 21 and the inner side surface 38. In this way, it is possible to prevent a situation where a restriction is posed on an arrangement space of the vibration element 5 since the angle θ is made unnecessarily small. For example, when the angle θ is set to θ<45° and the inner side surface 38 of the side wall portion 32 is further inclined, a space on the left side of the accommodation space SP in FIG. 1 is reduced, and the arrangement space of the vibration element 5 is reduced. That is, when θ<45°, a situation in which the inner side surface 38 of the side wall 32 comes into contact with the vibration element 5 occurs, and thus it is essential to reduce a size of the vibration element 5, leading to deterioration in vibration characteristics of the vibration element 5 and the like. In this regard, when a relationship of 90°>θ>45° is satisfied, it is possible to prevent the deterioration in the vibration characteristics of the vibration element 5 and the like due to the reduction in the arrangement space while preventing the deterioration in circuit characteristics of the first circuit element and the first circuit by reducing the maximum value of the stress that is a stress in the region in the vicinity of the bonding portion 36.

In the embodiment, in the lid 3, the inner side surface 38 of the side wall 32 may be along a crystal orientation <111> of single crystal silicon. Specifically, in FIGS. 13 and 14, α=35.3° and θ=54.7° may be satisfied. In this way, the maximum value of the stress, which is the stress at the position M20 in the vicinity of the bonding portion 36, can be sufficiently reduced, and the inclination of the inner side surface 38 of the side wall 32 can be formed by effectively utilizing wet etching. For example, a cavity that is the recess 30 in FIGS. 1 and 9 can be formed by wet etching the second semiconductor wafer 130 made of single crystal silicon in FIG. 6. For example, the single crystal silicon has a property that a <111> surface is lower in wet etching rate than a <100> surface and the like and is less likely to be etched. Accordingly, by performing wet etching on the second semiconductor wafer 130 made of single crystal silicon by crystal anisotropic etching using this property, the <111> surface for which the wet etching rate is low appears as the inner side surface 38 of the side wall 32. Accordingly, the inner side surface 38 of the side wall 32 along the crystal orientation <111> can be easily formed. Since the inner side surface 38 of the side wall 32 is along the crystal orientation <111>, the side wall 32 can be formed to have such an inclination that the inclination angle α=35.3° and the angle θ=54.7° that is formed by the first surface 21 and the inner side surface 38. Accordingly, the stress at the position M20 in the vicinity of the bonding portion 36 is reduced as illustrated in FIGS. 13 and 14, and the deterioration in the circuit characteristics of the first circuit element and the first circuit can be prevented.

Although the inclination of the inner side surface 38 of the side wall 32 is preferably formed by wet etching, the embodiment is not limited thereto, and various modifications can be made, such as forming the inclination by dry etching or forming the inclination by a combination of wet etching and dry etching.

For example, in dry etching, an etching gas, which is a reactive gas, is converted into a plasma, and with a high-frequency power supply or the like, active species of the plasma are brought into contact with and react with a semiconductor substrate such as a silicon substrate on which a mask of a resist is formed, thereby etching a front surface of the semiconductor substrate. As a plasma source, a capacitively coupled plasma (CCP), an electron cyclotron resonance plasma (ECR), an inductively coupled plasma (ICP), or the like can be used.

For example, in reactive ion etching (RIE) that is dry etching, in addition to positive ions and electrons, neutral active species called radicals exist in a plasma generated in a processing chamber. For example, the positive ions are accelerated by a voltage of a high-frequency power supply or the like and collide with the semiconductor substrate, so that the etching in an acceleration direction is performed on the semiconductor substrate. Accordingly, etching is performed on a bottom surface of the recess 30 of the lid 3. On the other hand, the neutral active species react with the semiconductor substrate, the resist of the mask, and the like to generate a reaction product. When the reaction product adheres to the side wall of the etched portion, the adhered reaction product serves as a mask, and for example, a forward taper can be formed at the side wall. Accordingly, a positive inclination can be formed at the inner side surface 39 of the lid 3.

Specifically, when dry etching is used, the angle θ can be controlled by controlling a substrate temperature of the silicon substrate of the lid 3 and a pressure in the processing chamber. For example, when the substrate temperature during reactive ion etching, which is dry etching, is increased, the angle θ approaches 90°. Also, when the pressure is decreased, the angle θ approaches 90°. On the other hand, when the substrate temperature is lowered, the angle θ is smaller than 90°. Also, when the pressure is increased, the angle θ is smaller than 90°. This is because an adsorption amount of the reaction product at the inner side surface 38 of the side wall 32 where the number of ion impacts is small increases due to a decrease in the substrate temperature or an increase in the pressure, and a thick polymerized film serving as a mask is formed at the inner side surface 38. As described, by controlling the substrate temperature and the pressure in the reactive ion etching, it is possible to control the angle θ to incline the inner side surface 38 of the side wall 32 at a desired angle. By changing a composition ratio of the reactive gas in the reactive ion etching, the angle θ may be controlled to incline the inner side surface 38 of the side wall 32 at a desired angle.

In the embodiment, as described with reference to FIG. 7 and the like, the lid 3 is formed of the second semiconductor wafer 130 that is bonded, by stress application, via the bonding portions 36 and 37 to the first semiconductor wafer 120 forming the base 2. In this way, the first semiconductor wafer 120 and the second semiconductor wafer 130 are bonded to each other and dicing or the like is performed, whereby a large number of vibrator devices 1 can be separated. Even when a stress is applied due to bonding of the first semiconductor wafer 120 and the second semiconductor wafer 130, since the angle formed by the first surface 21 and the inner side surface 38 satisfies the relationship of θ<90° according to the embodiment, the deterioration in the circuit characteristics of the first circuit element and the first circuit caused by stress application in the first region ARA can be prevented.

3. Arrangement of Circuit Element

Figure 15:
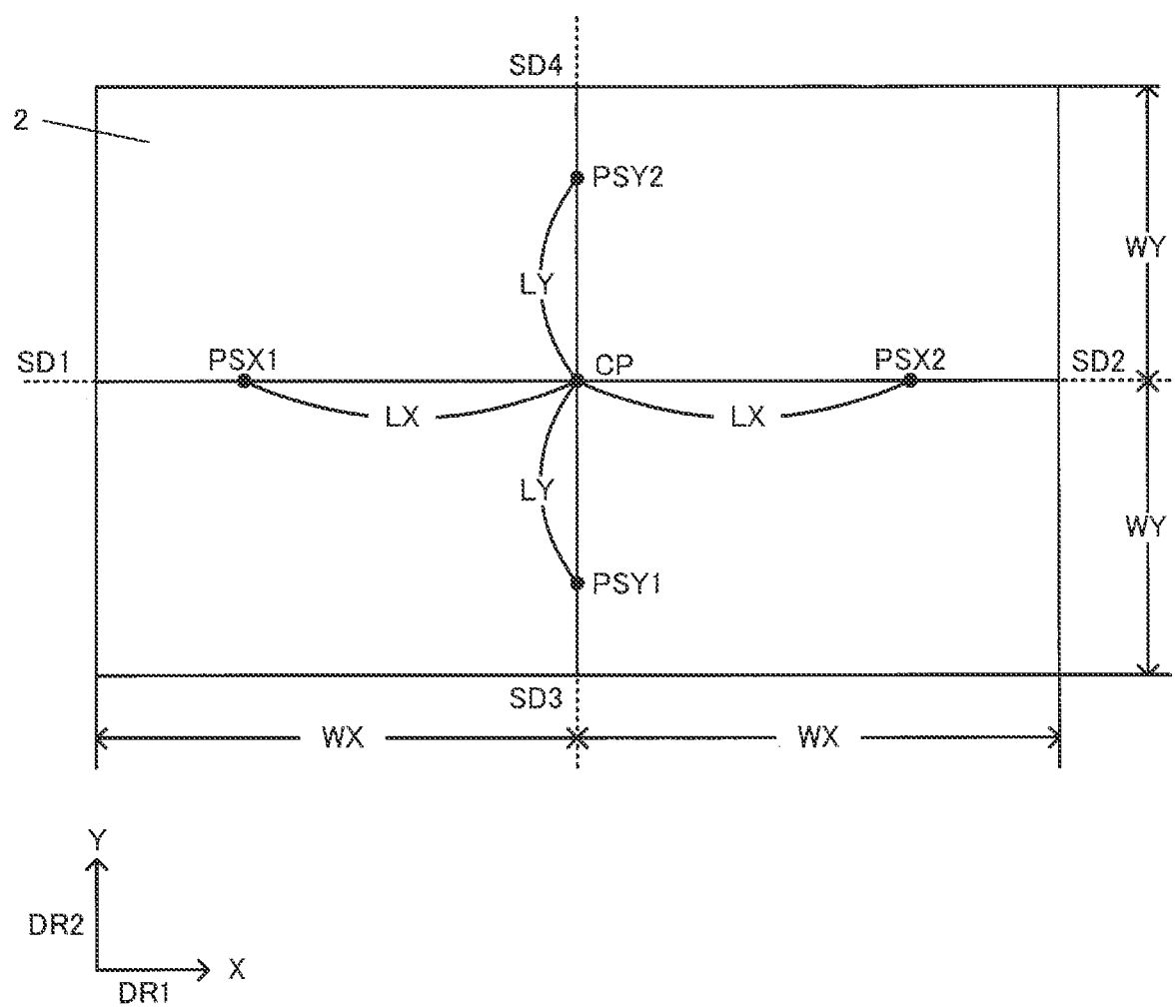
FIG. 15 is an explanatory diagram explaining a stress at each position of a base.
Figure 16:
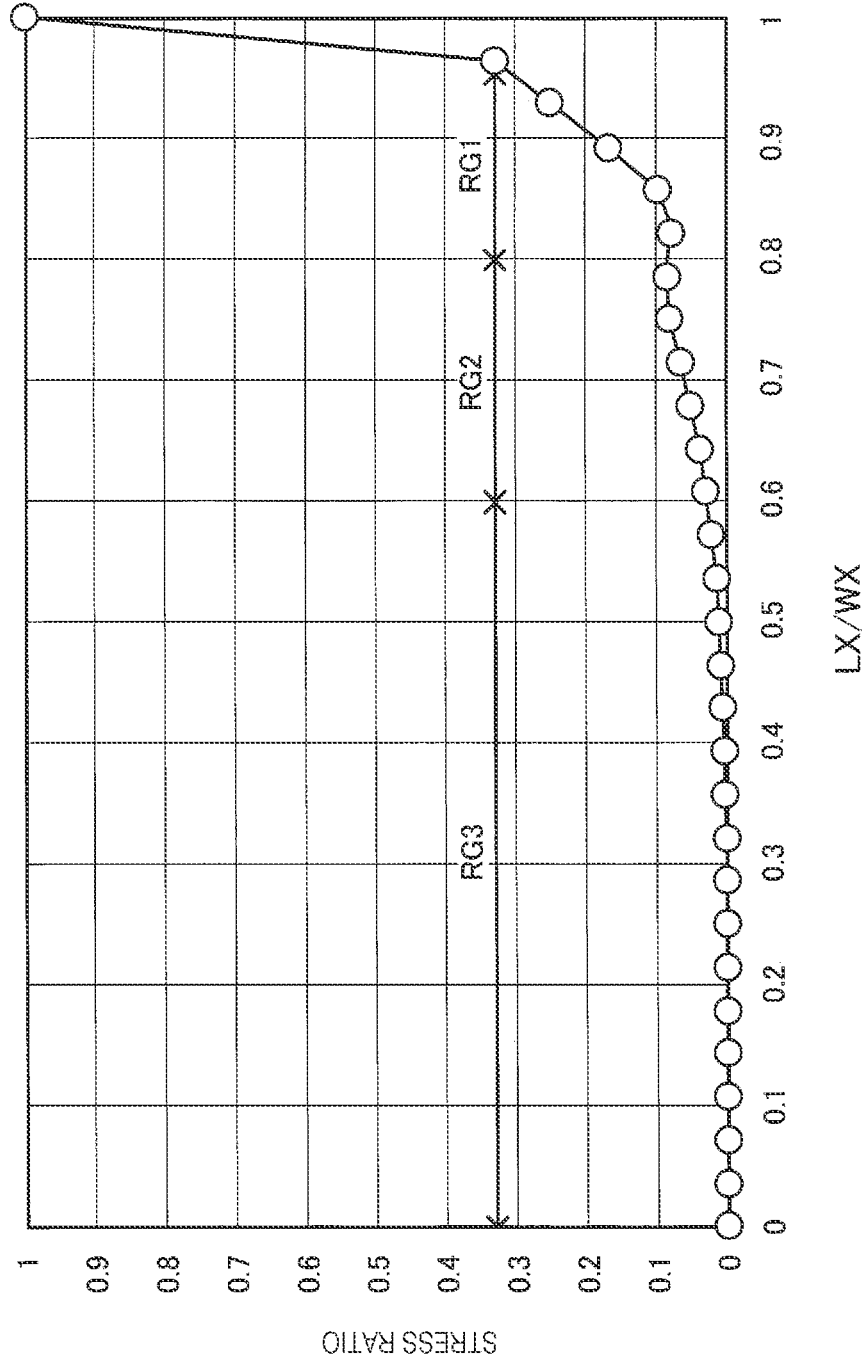
FIG. 16 is a graph illustrating a stress ratio at each position of the base.
Figure 17:
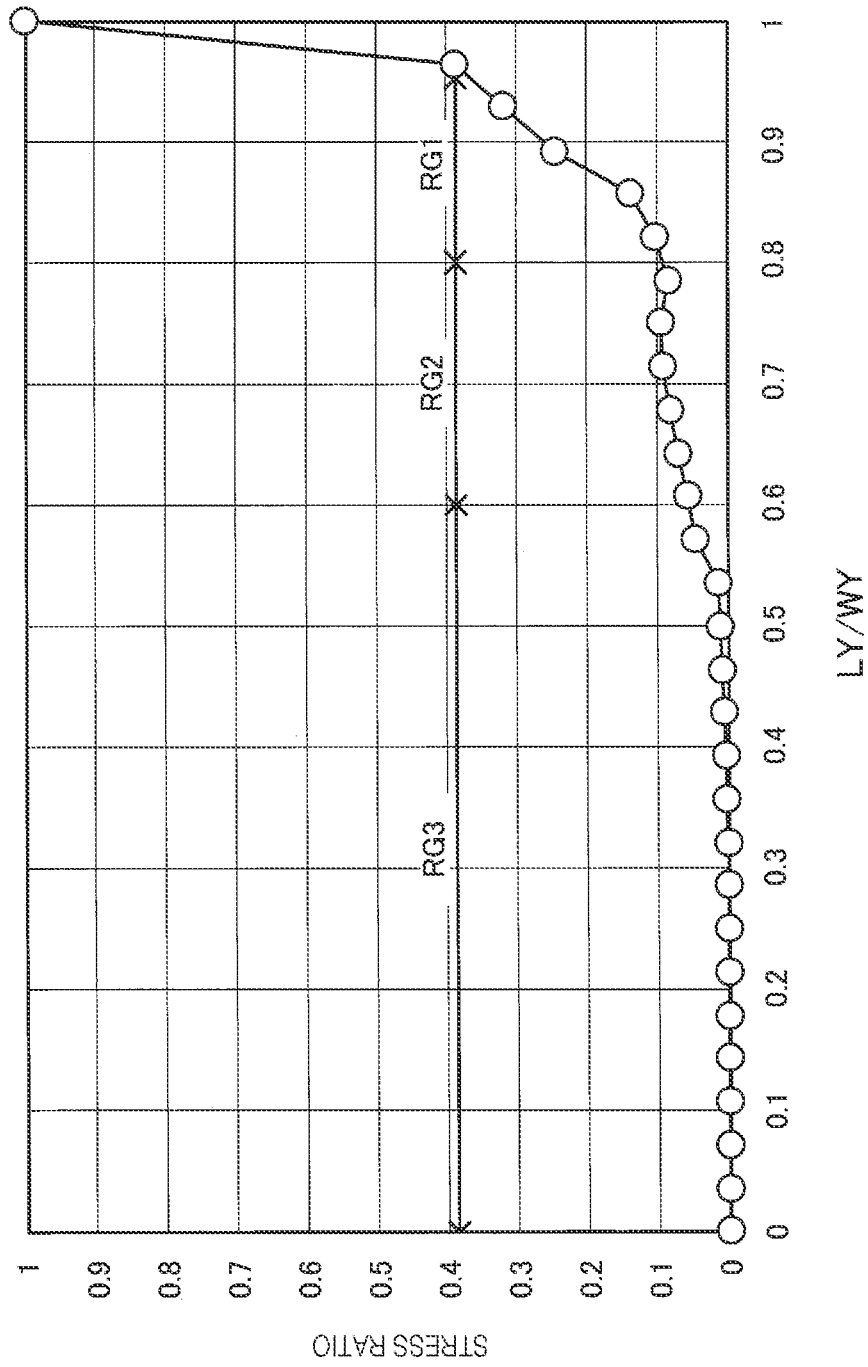
FIG. 17 is a graph illustrating a stress ratio at each position of the base.

Next, a detailed arrangement method of circuit elements in the integrated circuit 10 according to the embodiment will be described. FIG. 15 and FIGS. 16 and 17 are a diagram and graphs for explaining the stress at each position of the base 2.

For example, in FIG. 15, a distance in the first direction DR1 from the center point CP of the base 2 to the first side SD1 and the second side SD2 is defined as WX, and a distance in the second direction DR2 from the center point CP of the base 2 to the third side SD3 and the fourth side SD4 is defined as WY. A length of the base 2 in the first direction DR1 is 2×WX, and is, for example, about 1.0 mm to 1.2 mm or may be smaller or larger. The length 2×WX of the base 2 in the first direction DR1 is, for example, a length of the base 2 in a lateral direction, and is, for example, a length in a long side direction. A length of the base 2 in the second direction DR2 is 2×WY, and is, for example, about 0.8 mm to 1.0 mm or may be smaller or larger. The length 2×WY of the base 2 in the second direction DR2 is, for example, a length of the base 2 in a longitudinal direction, and is, for example, a length in a short side direction.

FIGS. 16 and 17 are graphs illustrating stress ratios at respective positions of the base 2. FIG. 16 is a graph illustrating stress ratios at respective positions in the first direction DR1 that is the long side direction of the base 2, and FIG. 17 is a graph illustrating stress ratios at respective positions in the second direction DR2 that is the short side direction of the base 2. The stress ratio is a ratio of the stress at each position to a stress at a position where the stress is maximum, and is set so that the stress ratio at the position where the stress is maximum is 1.0. The position where the stress is maximum is, for example, a position of the end of the base 2.

In FIG. 15, a distance between a point PSX1 and the center point CP in the first direction DR1 is defined as LX. A distance between a point PSX2 and the center point CP in the first direction DR1 is also LX. A distance between a point PSY1 and the center point CP in the second direction DR2 is defined as LY. A distance between a point PSY2 and the center point CP in the second direction DR2 is also LY.

In this case, in FIG. 16, a vertical axis represents the stress ratio, and a horizontal axis represents LX/WX. That is, the horizontal axis in FIG. 16 represents a distance ratio of the distance LX from the center point CP to the points PSX1 and PSX2 with respect to the WX of the base 2 in the first direction DR1. In FIG. 17, a vertical axis represents the stress ratio, and a horizontal axis represents LY/WY. That is, the horizontal axis in FIG. 17 represents a distance ratio of the distance LY from the center point CP to the points PSY1 and PSY2 with respect to the WY of the base 2 in the second direction DR2.

In addition, in FIGS. 16 and 17, in a range RG1 that is a first range, the stress ratio can be set to, for example, about 0.4 or less, and the stress ratio can be made smaller than that at the end of the base 2. The range RG1 is a range in which LX/WX and LY/WY are, for example, about 0.8 to 0.95.

In a range RG2 that is a second range, the stress ratio can be made smaller than the stress ratio in the range RG1, and can be set to, for example, about 0.1 or less. For example, in the range RG2, a change amount of the stress ratio in the range is smaller than that in the range RG1.

In a range RG3 that is a third range, the stress ratio can be made smaller than the stress ratio in the range RG2, and can be set to, for example, about 0.05 or less. For example, in the range RG3, a change amount of the stress ratio in the range is smaller than that in the range RG2. Hereinafter, for simplification, the stress ratio is also referred to as the stress as appropriate.

As described above, regarding the stresses at the respective positions of the base 2, there are a plurality of ranges RG1, RG2, and RG3 having different tendencies and characteristics of the stress in value, change amount and the like of the stress. On the other hand, the circuit or the circuit element provided in the integrated circuit 10 includes a circuit or a circuit element having a large change in circuit characteristic with respect to the stress and a circuit or a circuit element having a small change in circuit characteristic with respect to the stress. Therefore, in the embodiment, a method of arranging circuits or circuit elements having different changes in circuit characteristic with respect to the stress is adopted in consideration of the plurality of ranges having different tendencies and characteristics of the stress.

For example, in a region corresponding to a range in which the stress is large, a circuit or a circuit element having a small change in circuit characteristic with respect to the stress is disposed. In this way, even when a stress generated due to a cause or the like illustrated in FIG. 7 is applied to the circuit or the circuit element, since a change in circuit characteristic of the circuit or the circuit element is small, it is possible to prevent bad influence exerted by deterioration in the circuit characteristic caused by the stress. Since the circuit or the circuit element can be arranged in a region close to the end of the base 2, the arrangement area of the integrated circuit 10 in the vibrator device 1 can be enlarged. Accordingly, various circuit functions can be incorporated even in the vibrator device 1 of a WLP Type having a small size.

On the other hand, in a region corresponding to a range in which the stress is small, a circuit or a circuit element having a large change in circuit characteristic with respect to the stress is disposed. In this way, since a large stress is not applied to the circuit or the circuit element having a large change in circuit characteristic with respect to the stress, it is possible to prevent deterioration in the circuit characteristic caused by the stress. As described above, according to the embodiment, it is possible to enlarge the arrangement area of the integrated circuit 10 and to prevent deterioration in the circuit characteristic caused by the stress, and it is possible to implement the small-sized and highly functional vibrator device 1.

Next, the arrangement method of circuit elements according to the embodiment will be specifically described with reference to FIG. 18. For example, the integrated circuit 10 according to the embodiment includes a first circuit and a second circuit. The first circuit includes a first circuit element disposed in the first region ARA, and the second circuit includes a second circuit element disposed in the second region ARB.

The first circuit element or the first circuit is a circuit element or a circuit having a smaller change in circuit characteristic with respect to a stress than the second circuit element or the second circuit. For example, the first circuit element is a circuit element having a smaller change in circuit characteristic with respect to the stress than the second circuit element. Alternatively, the first circuit including the first circuit element is a circuit having a smaller change in circuit characteristic with respect to the stress than the second circuit including the second circuit element. For example, in a case where a change amount of the circuit characteristic of the first circuit element when a first stress is applied to the first circuit element is a first change amount and a change amount of the circuit characteristic of the second circuit element when the first stress is applied to the second circuit element is a second change amount, the first change amount is smaller than the second change amount. In a case where a change amount of the circuit characteristic of the first circuit when the first stress is applied to the first circuit element of the first circuit is a third change amount and a change amount of the circuit characteristic of the second circuit when the first stress is applied to the second circuit element of the second circuit is a fourth change amount, the third change amount is smaller than the fourth change amount.

The circuit element is a basic element constituting a circuit, and is, for example, a passive element or an active element. The passive element is, for example, a capacitive element, a resistive element, or an inductor element. For example, the passive element is an element that consumes, stores, or discharges supplied power. For example, the passive element is a circuit element that does not perform an active operation such as amplification or rectification of power. The active element is, for example, a transistor or a diode. The active element is a circuit element that performs an active operation such as amplification or rectification of power. For example, the active element is a circuit element having a function of amplifying, controlling, or modulating an input signal or energy and outputting the processed signal or energy. The circuit characteristic of the circuit element is, for example, a resistance, a capacitance, a resistance ratio, a capacitance ratio, an amplification factor, a threshold, a transistor size, a transistor size ratio, a forward voltage, or the like. The circuit characteristic of the circuit is a characteristic of a function implemented by the circuit. For example, in the case of a signal generation circuit, the circuit characteristic is a characteristic such as accuracy, a temperature characteristic, a frequency characteristic, a conversion characteristic, or an amplification characteristic of a generated signal. For example, in the case of a voltage generation circuit, the circuit characteristic is accuracy, a temperature characteristic or the like of a generated voltage, and in the case of a sensor circuit, the circuit characteristic is accuracy, a temperature characteristic, a frequency characteristic or the like of a detected sensor signal. In the case of a signal conversion circuit, the circuit characteristic is a signal conversion characteristic. For example, in the case of an A/D conversion circuit or a D/A conversion circuit, the circuit characteristic is an A/D conversion characteristic or a D/A conversion characteristic. In the case of a signal amplifier circuit, the circuit characteristic is an amplification characteristic or the like of a signal.

In the embodiment, the first circuit element having a smaller change in circuit characteristic with respect to the stress is disposed in the first region ARA, and the second circuit element having a larger change in circuit characteristic with respect to the stress is disposed in the second region ARB. Alternatively, the first circuit element provided in the first circuit having a smaller change in circuit characteristic with respect to the stress is disposed in the first region ARA, and the second circuit element provided in the second circuit having a larger change in circuit characteristic with respect to the stress is disposed in the second region ARB. The change in circuit characteristic with respect to the stress can also be referred to as stress sensitivity, and the first circuit element or the first circuit has lower stress sensitivity than the second circuit element or the second circuit. The first circuit element having lower stress sensitivity or the first circuit element provided in the first circuit having lower stress sensitivity is disposed in the first region ARA, and the second circuit element having higher stress sensitivity or the second circuit element provided in the second circuit having higher stress sensitivity is disposed in the second region ARB.

Figure 18:
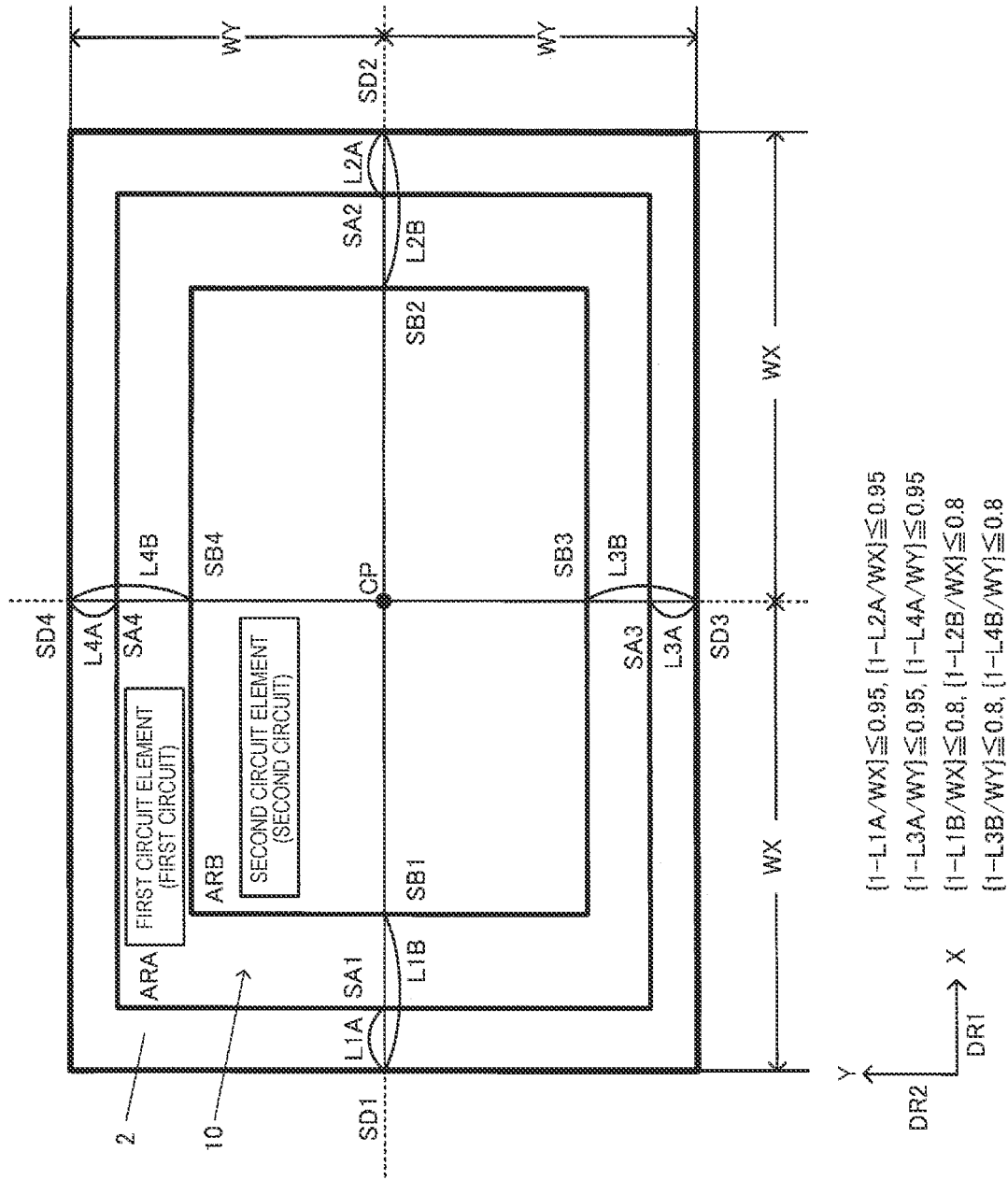
FIG. 18 is an explanatory diagram explaining an arrangement method of circuit elements according to the embodiment.

In FIG. 18, a distance in the first direction DR1 from the center point CP of the base 2 to the first side SD1 and the second side SD2 is defined as WX, and a distance in the second direction DR2 from the center point CP to the third side SD3 and the fourth side SD4 is defined as WY. A distance in the first direction DR1 between the first side SD1 and a corresponding side SA1 of the first region ARA is defined as L1A, and a distance in the first direction DR1 between the second side SD2 and a corresponding side SA2 of the first region ARA is defined as L2A. A distance in the second direction DR2 between the third side SD3 and a corresponding side SA3 of the first region ARA is defined as L3A, and a distance in the second direction DR2 between the fourth side SD4 and a corresponding side SA4 of the first region ARA is defined as L4A.

A distance in the first direction DR1 between the first side SD1 and a corresponding side SB1 of the second region ARB is defined as L1B, and a distance in the first direction DR1 between the second side SD2 and a corresponding side SB2 of the second region ARB is defined as L2B. A distance in the second direction DR2 between the third side SD3 and a corresponding side SB3 of the second region ARB is defined as L3B, and a distance in the second direction DR2 between the fourth side SD4 and a corresponding side SB4 of the second region ARB is defined as L4B. Here, the corresponding side is, for example, a facing side.

In this case, the following expressions (1) and (2) are established in the embodiment.

$$\{1 - L1A/WX\} \le 0.95 \quad (1)$$

$$\{1 - L2A/WX\} \le 0.95$$

$$\{1 - L3A/WY\} \le 0.95$$

$$\{1 - L4A/WY\} \le 0.95$$

$$\{1 - L1B/WX\} \le 0.8 \quad (2)$$

$$\{1 - L2B/WX\} \le 0.8$$

$$\{1 - L3B/WY\} \le 0.8$$

$$\{1 - L4B/WY\} \le 0.8$$

Expression (1) corresponds to the range RG1 in FIGS. 16 and 17, and expression (2) corresponds to the ranges RG2 and RG3. That is, when expression (1) is satisfied, a stress applied to the first circuit element in the first region ARA is a stress corresponding to the range RG1. Accordingly, it is possible to ensure that the stress applied to the first circuit element in the first region ARA is, for example, about 40% or less of the maximum stress as in the range RG1 in FIGS. 16 and 17. As described above, the first circuit element disposed in the first region ARA is a circuit element having a smaller change in circuit characteristic with respect to the stress and having lower stress sensitivity. Therefore, when the stress is 40% or less of the maximum stress, since the stress sensitivity of the first circuit element is low, deterioration in the circuit characteristic of the first circuit element or the first circuit including the first circuit element is not a problem. Since the boundary of the first region ARA, which is a circuit arrangement region, can be brought as close as possible to the end of the base 2, the arrangement area of the integrated circuit 10 can be enlarged, and the integrated circuit 10 can be made highly functional.

On the other hand, expression (2) corresponds to the ranges RG2 and RG3 in FIGS. 16 and 17. That is, when expression (2) is satisfied, a stress applied to the second circuit element in the second region ARB is a stress corresponding to the ranges RG2 and RG3. Accordingly, it is possible to ensure that the stress applied to the second circuit element in the second region ARB is, for example, about 10% or less of the maximum stress as in the ranges RG2 and RG3 in FIGS. 16 and 17. In the ranges RG2 and RG3, a change amount in stress in the ranges is smaller than that in the range RG1. The second circuit element disposed in the second region ARB is a circuit element having a larger change in circuit characteristic with respect to the stress and higher stress sensitivity than the first circuit element in the first region ARA. However, if the stress is, for example, 10% or less of the maximum stress, a change in circuit characteristic of the second circuit element or in circuit characteristic of the second circuit including the second circuit element is small, and thus the deterioration in the circuit characteristic caused by the stress can be prevented.

As described above, according to the embodiment, the following relationships are established for the first region ARA in which the first circuit element having a smaller change in circuit characteristic with respect to the stress is disposed.

$$\{1 - L1A/WX\} \le 0.95$$
$$\{1 - L2A/WX\} \le 0.95$$
$$\{1 - L3A/WY\} \le 0.95$$
$$\{1 - L4A/WY\} \le 0.95$$

In this way, the boundary of the first region ARA can be brought close to the end of the base 2, and the arrangement area of the integrated circuit 10 can be enlarged. The following relationships are established for the second region ARB in which the second circuit element having a larger change in circuit characteristic with respect to the stress is disposed.

$$\{1 - L1B/WX\} \le 0.8$$
$$\{1 - L2B/WX\} \le 0.8$$
$$\{1 - L3B/WY\} \le 0.8$$
$$\{1 - L4B/WY\} \le 0.8$$

In this way, it is possible to prevent the deterioration in the circuit characteristic of the second circuit element or the second circuit including the second circuit element caused by the stress. As described above, according to the embodiment, the arrangement region can be divided by the circuit element having low stress sensitivity and the circuit element having high stress sensitivity, and the arrangement region of the integrated circuit 10 can be maximized. Accordingly, compared to a structure in the related art, a larger number of functions can be provided in a region having the same area, and the small-sized and highly functional vibrator device 1 can be implemented.

In the embodiment, the following expression (3) may be established.

$$\{1 - L1B/WX\} \le 0.6 \quad (3)$$
$$\{1 - L2B/WX\} \le 0.6$$
$$\{1 - L3B/WY\} \le 0.6$$
$$\{1 - L4B/WY\} \le 0.6$$

Expression (3) corresponds to the range RG3 in FIGS. 16 and 17. That is, when expression (3) is satisfied, a stress applied to the second circuit element in the second region ARB is a stress corresponding to the range RG3. Accordingly, it is possible to ensure that the stress applied to the second circuit element in the second region ARB is, for example, about 5% or less of the maximum stress as in the range RG3 in FIGS. 16 and 17. Accordingly, it is possible to further prevent the deterioration in the circuit characteristic of the second circuit element or the second circuit including the second circuit element caused by the stress.

In the embodiment, the following expression (4) may be established.

$$\{1 - L1A/WX\} \le 0.8 \quad (4)$$
$$\{1 - L2A/WX\} \le 0.8$$
$$\{1 - L3A/WY\} \le 0.8$$
$$\{1 - L4A/WY\} \le 0.8$$

Expression (4) corresponds to the range RG2 in FIGS. 16 and 17. That is, when expression (4) is satisfied, a stress applied to the first circuit element in the first region ARA is a stress corresponding to the range RG2. Accordingly, it is possible to ensure that the stress applied to the first circuit element in the first region ARA is, for example, about 40% or less of the maximum stress as in the range RG2 in FIGS. 20 and 21, and it is possible to prevent the deterioration in the circuit characteristic of the first circuit element or the first circuit including the first circuit element caused by the stress.

In the embodiment, the following expression (5) may be established.

$$0.8 < \{1 - L1A/WX\} \le 0.95 \quad (5)$$
$$0.8 < \{1 - L2A/WX\} \le 0.95$$
$$0.8 < \{1 - L3A/WY\} \le 0.95$$
$$0.8 < \{1 - L4A/WY\} \le 0.95$$

For example, 1−L1A/WX, 1−L2A/WX, 1−L3A/WY, and 1−L4A/WY correspond to distance ratios of WX−L1A, WX−L2A, WX−L3A, and WX−L4A, which are distances from the center point CP of the base 2 to corresponding sides of the first region ARA, with respect to WX and WY. When expression (5) is established, an upper limit of the distance ratio for the first region ARA is set to 0.95, and a lower limit of the distance ratio is set to 0.8. In this way, the first circuit element can be disposed in the first region ARA where the distance ratios of the distances from the center point CP of the base 2 to the corresponding side of the first region ARA with respect to WX and WY are more than 0.8 and 0.95 or less.

4. Integrated Circuit

Figure 19:
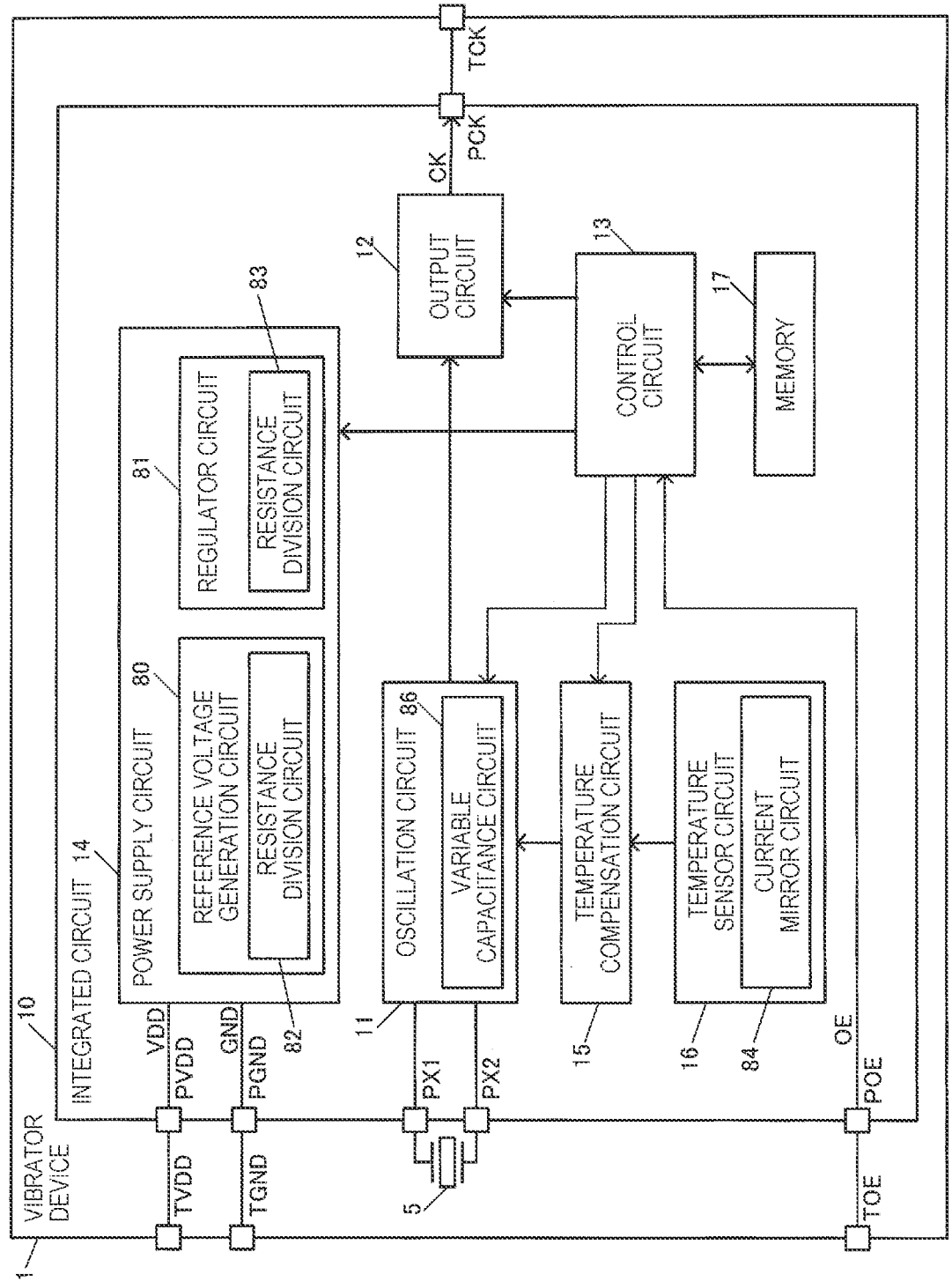
FIG. 19 is a diagram illustrating a configuration example of the integrated circuit.

FIG. 19 illustrates a configuration example of the integrated circuit 10 according to the embodiment. The integrated circuit 10 includes an oscillation circuit 11 and an output circuit 12. The integrated circuit 10 may include a control circuit 13, a power supply circuit 14, a temperature compensation circuit 15, a temperature sensor circuit 16, and a memory 17. The vibrator device 1 according to the embodiment includes the vibration element 5 and the integrated circuit 10, and the vibration element 5 and the integrated circuit 10 are electrically coupled to each other. Configurations of the integrated circuit 10 and the vibrator device 1 are not limited to the configurations in FIG. 19 and configurations in FIG. 20 to be described later, and various modifications can be made such as omitting some of the components, adding other components, and replacing some of the components with other components.

The vibrator device 1 includes terminals TCK, TOE, TVDD, and TGND. The terminal TCK is a terminal for outputting a clock signal CK, and the terminal TOE is a terminal for inputting an output enable signal OE. The TVDD is a terminal to which VDD as a power supply voltage is supplied, and the TGND is a terminal to which GND as a ground voltage is supplied. GND can also be referred to as VSS. For example, VDD corresponds to a high-potential-side power supply voltage, and GND corresponds to a low-potential-side power supply voltage. The terminals TCK, TOE, TVDD, and TGND correspond to the external coupling terminals 91 and 92 in FIG. 1. For example, in the case of the vibrator device 1 having four terminals, four terminals are provided as the external coupling terminals 91 and 92. The number of terminals of the vibrator device 1 is not limited to four, and may be four or more or four or less. The integrated circuit 10 includes pads PCK, POE, PVDD, PGND, PX1, and PX2. The pads are terminals of the integrated circuit 10. The pads PCK, POE, PVDD, and PGND are electrically coupled to the terminals TCK, TOE, TVDD, and TGND of the vibrator device 1.

The oscillation circuit 11 is a circuit configured to oscillate the vibration element 5. For example, the oscillation circuit 11 is electrically coupled to the vibration element 5 via the pads PX1 and PX2, and generates an oscillation signal by oscillating the vibration element 5. For example, the oscillation circuit 11 can be implemented by a drive circuit for oscillation provided between the pad PX1 and the pad PX2 and a passive element such as a capacitor or a resistor. The drive circuit can be implemented by, for example, a CMOS inverter circuit or a bipolar transistor. The drive circuit is a core circuit of the oscillation circuit 11, and the drive circuit drives the vibration element 5 by a voltage or a current to oscillate the vibration element 5. As the oscillation circuit 11, various types of oscillation circuits such as an inverter type, a Pierce type, a Colpitts type, or a Hartley type can be used. The oscillation circuit 11 is provided with, for example, a variable capacitance circuit 86, and an oscillation frequency can be adjusted by adjusting a capacitance of the variable capacitance circuit 86. The variable capacitance circuit 86 can be implemented by a variable capacitance element such as a varactor. Alternatively, the variable capacitance circuit 86 may be implemented by a capacitor array and a switch array coupled to the capacitor array. For example, the variable capacitance circuit 86 may be implemented by a capacitor array including a plurality of capacitors whose capacitance values are binarily weighted, and a switch array including a plurality of switches in which each switch turns on and off coupling between a corresponding capacitor of the capacitor array and the pad PX1 or the pad PX2.

The output circuit 12 outputs the clock signal CK based on an oscillation signal. For example, the output circuit 12 buffers an oscillation clock signal based on the oscillation signal and outputs the buffered oscillation clock signal as the clock signal CK to the pad PCK. The clock signal CK is output to the outside via the terminal TCK of the vibrator device 1. For example, the output circuit 12 outputs the clock signal CK in a single-ended CMOS signal format. For example, when the output enable signal OE received via the pad POE from the terminal TOE is active, the output circuit 12 outputs the clock signal CK under the control of the control circuit 13. On the other hand, when the output enable signal OE is inactive, the output circuit 12 sets the clock signal CK to a fixed voltage level such as a low level. The output circuit 12 may output a differential clock signal in a signal format such as low voltage differential signaling (LVDS), positive emitter coupled logic (PECL), high speed current steering logic (HCSL), or differential complementary MOS (CMOS). In this case, two clock terminals or pads for a positive polarity and a negative polarity of the differential clock signal may be provided, and thus the vibrator device 1 is, for example, an oscillator having six terminals.

The control circuit 13 is a logic circuit and performs various types of control processing. For example, the control circuit 13 controls the entire integrated circuit 10 or controls an operation sequence of the integrated circuit 10. The control circuit 13 may control the oscillation circuit 11, the power supply circuit 14, the temperature compensation circuit 15, the memory 17 and the like. The control circuit 13 can be implemented by a circuit of an application specific integrated circuit (ASIC) based on automatic placement and wiring such as a gate array.

In the power supply circuit 14, the power supply voltage VDD is supplied via the pad PVDD from the terminal TVDD, and the ground voltage GND is supplied via the pad PGND from the terminal TGND. The power supply circuit 14 supplies power supply voltages for respective internal circuits of the integrated circuit 10 to the respective internal circuits.

The power supply circuit 14 includes a reference voltage generation circuit 80, and the reference voltage generation circuit 80 generates a reference voltage to be used in the integrated circuit 10. The reference voltage generation circuit 80 includes a resistance division circuit 82. The power supply circuit 14 includes a regulator circuit 81, and the regulator circuit 81 generates a regulated voltage to be used in the integrated circuit 10. The regulated voltage is supplied to each circuit of the integrated circuit 10 such as the oscillation circuit 11, the output circuit 12, and the control circuit 13. The regulator circuit 81 includes a resistance division circuit 83. Details of the reference voltage generation circuit 80 and the regulator circuit 81 will be described later.

The temperature compensation circuit 15 performs temperature compensation for an oscillation frequency of the oscillation circuit 11. The output circuit 12 outputs a clock signal CK based on a temperature-compensated oscillation signal. Specifically, the temperature compensation circuit 15 performs temperature compensation based on a temperature detection signal from the temperature sensor circuit 16. For example, the temperature compensation circuit 15 generates a temperature compensation voltage based on a temperature detection voltage from the temperature sensor circuit 16, and outputs the generated temperature compensation voltage to the oscillation circuit 11, thereby performing temperature compensation for the oscillation frequency of the oscillation circuit 11. For example, the temperature compensation circuit 15 outputs, to the variable capacitance circuit 86 provided in the oscillation circuit 11, a temperature compensation voltage that is a capacitance control voltage of the variable capacitance circuit 86. In this case, the variable capacitance circuit 86 of the oscillation circuit 11 is implemented by a variable capacitance element such as a varactor. The temperature compensation is processing of performing compensation by reducing fluctuation in the oscillation frequency caused by temperature fluctuation. For example, the temperature compensation circuit 15 performs analog temperature compensation using polynomial approximation. For example, when the temperature compensation voltage for compensating frequency-temperature characteristics of the vibration element 5 is approximated using a polynomial, the temperature compensation circuit 15 performs analog temperature compensation based on coefficient information of the polynomial. The analog temperature compensation is temperature compensation implemented by, for example, addition processing of a current signal or a voltage signal that is an analog signal. Specifically, the coefficient information of the polynomial for temperature compensation is stored in the memory 17, and the control circuit 13 reads the coefficient information from the memory 17 and sets the coefficient information in, for example, a register of the temperature compensation circuit 15. The temperature compensation circuit 15 performs the analog temperature compensation based on the coefficient information set in the register.

Further, the temperature compensation circuit 15 may perform digital temperature compensation. In this case, the temperature compensation circuit 15 is implemented by, for example, a logic circuit. Specifically, the temperature compensation circuit 15 performs digital temperature compensation processing based on temperature detection data that is a temperature detection signal of the temperature sensor circuit 16. For example, the temperature compensation circuit 15 obtains frequency adjustment data based on the temperature detection data. A capacitance value of the variable capacitance circuit 86 of the oscillation circuit 11 is adjusted based on the obtained frequency adjustment data, thereby implementing the temperature compensation processing for the oscillation frequency of the oscillation circuit 11. In this case, the variable capacitance circuit 86 of the oscillation circuit 11 is implemented by a capacitor array including a plurality of binary-weighted capacitors and a switch array. The memory 17 stores a look-up table indicating correspondence between the temperature detection data and the frequency adjustment data, and the temperature compensation circuit 15 uses the look-up table read from the memory 17 by the control circuit 13 to perform temperature compensation processing of obtaining the frequency adjustment data based on the temperature data.

The temperature sensor circuit 16 is a sensor circuit configured to detect a temperature. The temperature sensor circuit 16 includes a current mirror circuit 84. Specifically, the temperature sensor circuit 16 outputs, as a temperature detection voltage, a temperature-dependent voltage that changes according to an environmental temperature. For example, the temperature sensor circuit 16 generates a temperature detection voltage using a circuit element having temperature dependence. Specifically, the temperature sensor circuit 16 outputs, by using temperature dependence of a forward voltage of a PN junction, the temperature detection voltage whose voltage value changes according to the temperature. As the forward voltage of a PN junction, for example, a voltage between a base and an emitter of a bipolar transistor can be used.

When performing digital temperature compensation processing, the temperature sensor circuit 16 measures a temperature such as an environmental temperature and outputs a result thereof as temperature detection data. The temperature detection data is, for example, data that monotonically increases or monotonically decreases with respect to the temperature. As the temperature sensor circuit 16 in this case, a temperature sensor circuit utilizing a fact that an oscillation frequency of a ring oscillator has temperature dependence can be used. Specifically, the temperature sensor circuit 16 includes a ring oscillator and a counter circuit. The counter circuit counts an output pulse signal, which is an oscillation signal of the ring oscillator, in a count period defined by a clock signal based on an oscillation signal from the oscillation circuit 11, and outputs a count value as temperature detection data.

The memory 17 stores various types of information used in the integrated circuit 10. The memory 17 is, for example, a nonvolatile memory. Although the nonvolatile memory is an EEPROM such as a floating gate avalanche injection MOS (FAMOS) memory or a metal-oxide-nitride-oxide-silicon (MONOS) memory, the nonvolatile memory is not limited thereto and may be a one time programmable (OTP) memory or a fuse ROM. Alternatively, the memory 17 may be implemented by a volatile memory such as a RAM.

Figure 20:
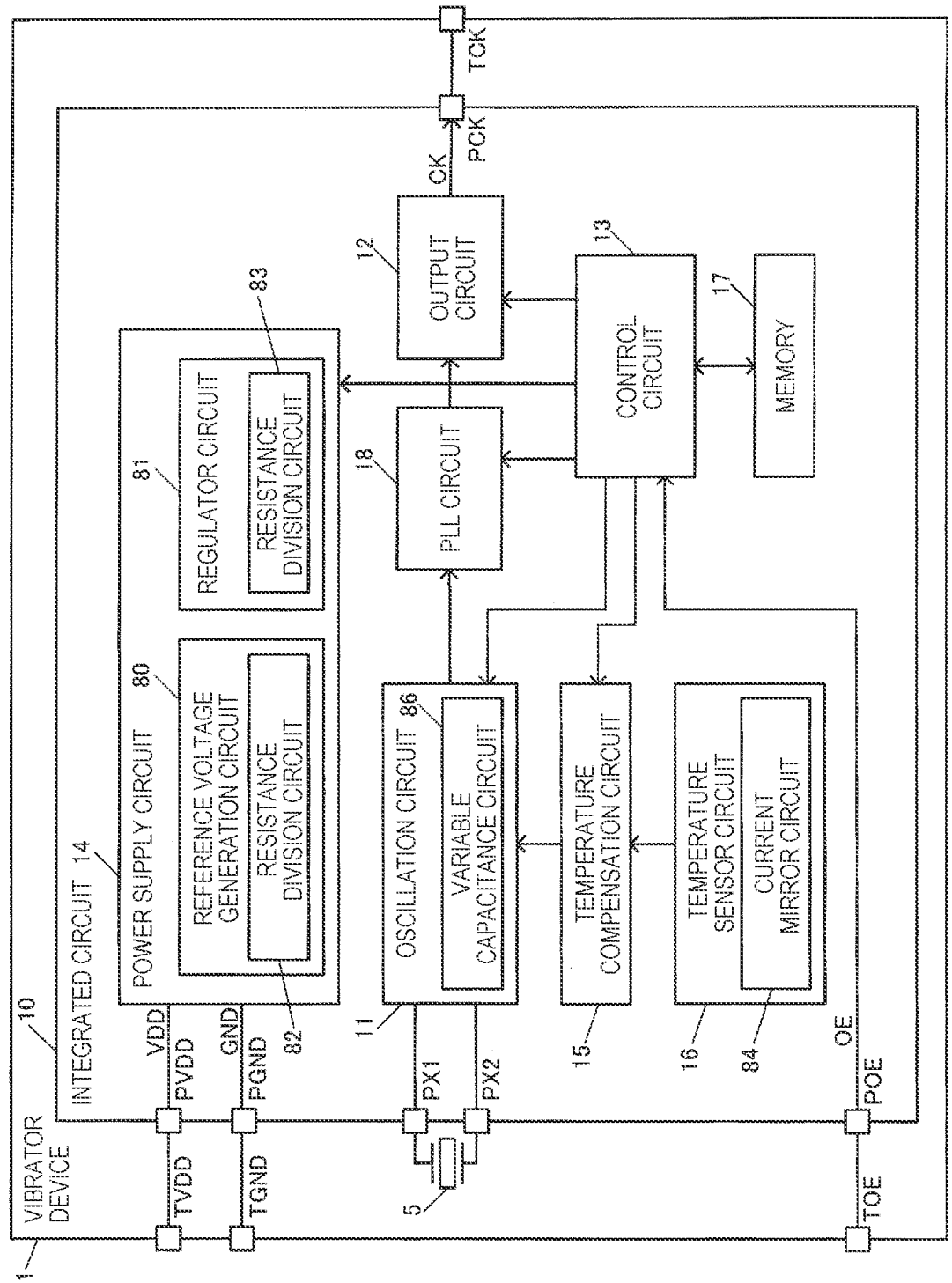
FIG. 20 is a diagram illustrating another configuration example of the integrated circuit.

FIG. 20 illustrates another configuration example of the integrated circuit 10. In FIG. 20, a PLL circuit 18 is further provided in addition to the configuration in FIG. 19. The PLL circuit 18 outputs, to the output circuit 12, a clock signal obtained by multiplying a frequency of an oscillation clock signal based on an oscillation signal from the oscillation circuit 11. Accordingly, a clock signal CK obtained by multiplying the frequency of the oscillation signal of the oscillation circuit 11 is output from the terminal TCK. The PLL circuit 18 includes, for example, a phase comparator circuit, a charge pump circuit, a voltage-controlled oscillation circuit, and a divider circuit (not shown). As the PLL circuit 18, for example, a fractional-N type PLL circuit can be used. For example, a delta-sigma modulation circuit is provided in the control circuit 13, and the delta-sigma modulation circuit performs delta-sigma modulation, so that the PLL circuit 18 operates as a fractional-N type PLL circuit. In this way, not only an integer but also a fraction can be set as a division ratio of the PLL circuit 18, and the clock signal CK of any frequency can be output. In this case, the temperature compensation circuit 15 may perform analog temperature compensation, and implement the temperature compensation by outputting a temperature compensation voltage to the variable capacitance circuit 86 of the oscillation circuit 11. Alternatively, the temperature compensation circuit 15 may perform digital temperature compensation, and implement the temperature compensation by setting a division ratio of the PLL circuit 18 by delta-sigma modulation based on temperature compensation data and frequency adjustment data.

5. First Circuit, Second Circuit, First Circuit Element, and Second Circuit Element Next, an arrangement method of the first circuit, the second circuit, the first circuit element, and the second circuit element in the embodiment will be described with reference to FIG. 21 and the like. As described with reference to FIG. 18 and the like, the integrated circuit 10 according to the embodiment includes the first circuit and the second circuit, the first circuit includes the first circuit element disposed in the first region ARA, and the second circuit includes the second circuit element disposed in the second region ARB. The first circuit element or the first circuit is a circuit element or a circuit having a smaller change in circuit characteristic with respect to a stress than the second circuit element or the second circuit. Hereinafter, specific examples and arrangement methods of the first circuit, the second circuit, the first circuit element, and the second circuit element will be described.

In the embodiment, the first circuit is, for example, a circuit whose circuit characteristic is set using a ratio of a circuit constant of the first circuit element. The circuit constant is, for example, a resistance, a capacitance, or a transistor size, and the first circuit is a circuit whose circuit characteristic is set using a resistance ratio, a capacitance ratio, or a transistor size ratio. The circuit constant is not limited to a resistance, a capacitance, or a transistor size, and may be, for example, an inductance, a transistor threshold, or an amplification factor. As described above, in the case of the first circuit whose circuit characteristic is set using a ratio of a circuit constant of the first circuit element, even when a stress is applied and, for example, the circuit constant of the first circuit element changes, the circuit characteristic set using the ratio of the circuit constant is unlikely to change. That is, a change amount of the ratio of the circuit constant of the first circuit element due to stress application is sufficiently smaller than a change amount of the circuit constant itself of the first circuit element due to stress application. Therefore, for example, even when a stress is applied as illustrated in FIG. 7, the circuit characteristic of the first circuit set using the ratio of the circuit constant of the first circuit element is unlikely to change. Therefore, in the case of a first circuit element of such a first circuit, even when the first circuit element is disposed in the first region ARA close to the end of the base 2, it is possible to sufficiently prevent deterioration in the circuit characteristic caused by stress application. By disposing the first circuit element of the first circuit in the first region ARA, an arrangement region of the integrated circuit 10 can be brought close to the end of the base 2, and an arrangement area of the integrated circuit 10 can be enlarged.

For example, the first circuit is a circuit in which a plurality of passive elements or a plurality of active elements are provided as the first circuit element, and a circuit characteristic is set using a ratio of a circuit constant of the plurality of passive elements or the plurality of active elements. The passive element is, for example, a resistive element, a capacitive element, or an inductor element, and the ratio of the circuit constant of the plurality of passive elements is, for example, a resistance ratio, a capacitance ratio, or an inductor ratio. The active element is, for example, a transistor or a diode, and the ratio of the circuit constant of the plurality of active elements is, for example, a ratio of a transistor size, a ratio of a threshold, a ratio of a forward voltage, or a ratio of an amplification factor. As described above, in the case of the first circuit whose circuit characteristic is set using a ratio of a circuit constant of the plurality of passive elements or the plurality of active elements, even when a stress is applied and the circuit constant of the passive elements or the active elements is changed, the circuit characteristic set using the ratio of the circuit constant is unlikely to change. Therefore, in the case of passive elements or active elements of such a first circuit, even when the passive elements or active elements are arranged in the first region ARA close to the end of the base 2, it is possible to sufficiently prevent deterioration in the circuit characteristic caused by stress application. By arranging the passive elements or the active elements of the first circuit in the first region ARA, the arrangement area of the integrated circuit 10 can be enlarged.

Figure 21:
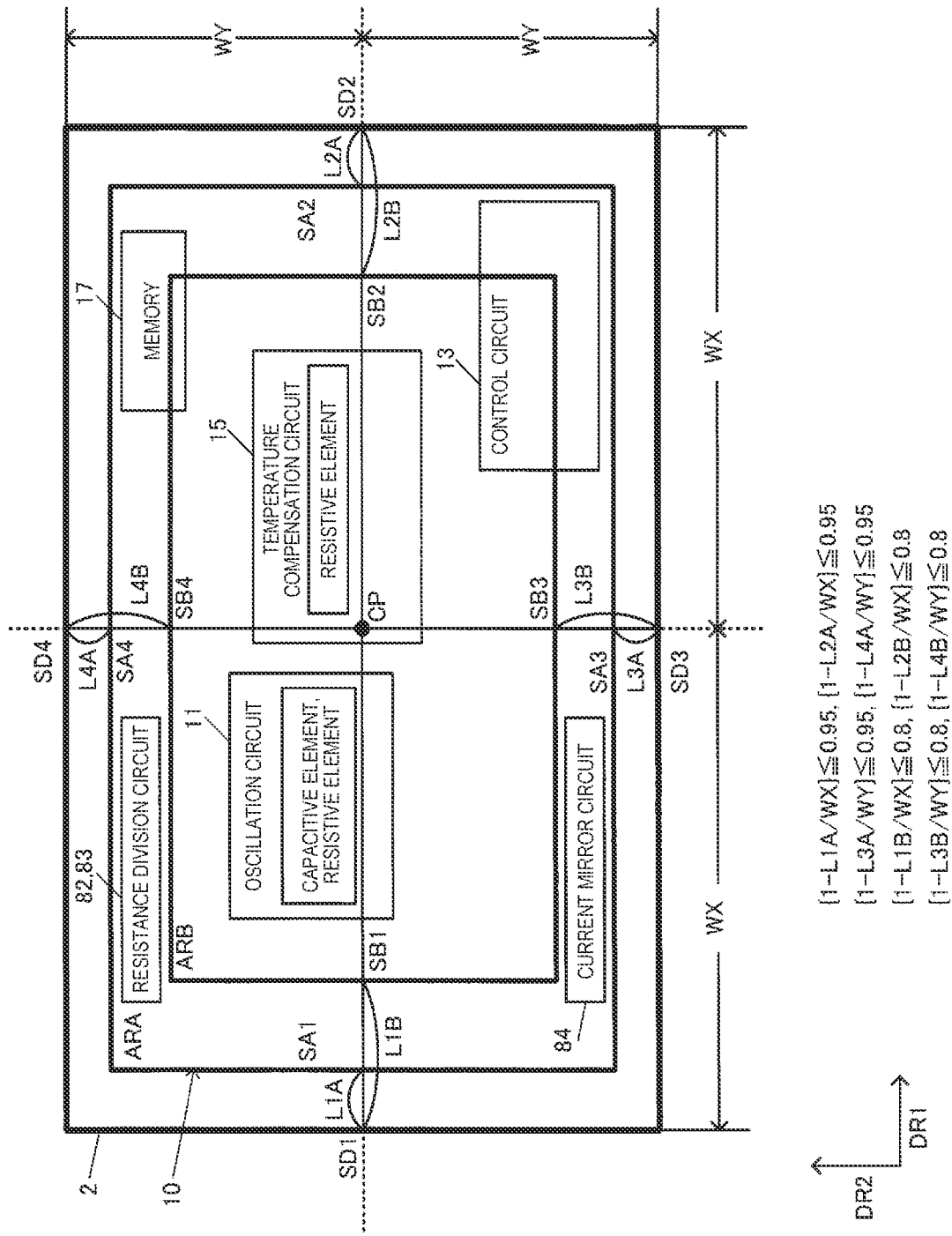
FIG. 21 is an explanatory diagram explaining an arrangement method of the first circuit, the second circuit, the first circuit element, and the second circuit element.

The first circuit element disposed in the first region ARA is a plurality of resistive elements provided in a resistance voltage divider circuit, or a plurality of transistors provided in a current mirror circuit. For example, FIG. 21 is a diagram schematically illustrating the arrangement of the first circuit, the second circuit, the first circuit element, and the second circuit element in the integrated circuit 10. In FIG. 21, the resistance division circuits 82 and 83 and the current mirror circuit 84 are arranged in the first region ARA. As described with reference to FIGS. 19 and 20, for example, the resistance division circuit 82 is provided in the reference voltage generation circuit 80, and the resistance division circuit 83 is provided in the regulator circuit 81. The current mirror circuit 84 is provided, for example, in the temperature sensor circuit 16. The resistance division circuits 82 and 83 are circuits for each of which a circuit characteristic is set using a resistance ratio of a plurality of resistive elements, and for example, the circuit characteristic such as a divided voltage generated by the resistance division circuits 82 and 83 is set using the resistance ratio. The resistance division circuits 82 and 83 are circuits for each of which a circuit characteristic is set using a ratio of a circuit constant of a plurality of passive elements, and are circuits for each of which a circuit characteristic is set using a ratio of a circuit constant of a first circuit element. The current mirror circuit 84 is a circuit whose circuit characteristic is set using a size ratio of a plurality of transistors, and for example, the circuit characteristic such as a mirror ratio of a current mirror is set using a transistor size ratio. The current mirror circuit 84 is a circuit whose circuit characteristic is set using a ratio of a circuit constant of a plurality of active elements, and is a circuit whose circuit characteristic is set using a ratio of a circuit constant of a first circuit element. In the case of the resistance division circuits 82 and 83 and the current mirror circuit 84, even when a stress is applied and a resistance of the resistive elements or a transistor characteristic changes, the circuit characteristic set using the resistance ratio or the transistor size ratio is unlikely to change. Accordingly, in the case of the plurality of resistive elements of the resistance division circuits 82 and 83 and the plurality of transistors of the current mirror circuit 84, as illustrated in FIG. 21, even when being arranged in the first region ARA close to the ends of the base 2, it is possible to prevent bad influence exerted by deterioration in the circuit characteristic caused by stress application. By arranging the plurality of resistive elements and the plurality of transistors in the first region ARA, the arrangement area of the integrated circuit 10 can be enlarged.

The circuit whose circuit characteristic is set using a ratio of a circuit constant of a circuit element is not limited to the resistance division circuits 82 and 83 and the current mirror circuit 84, and includes various circuits such as an amplifier circuit for which an amplification factor is set using a capacitance ratio or a resistance ratio or a circuit configured to generate a voltage or a current by using a transistor size ratio.

As described, the first circuit is the reference voltage generation circuit 80 configured to generate a reference voltage to be used in the integrated circuit 10, and the first circuit element is the resistive elements provided in the resistance division circuit 82 of the reference voltage generation circuit 80. That is, in FIG. 21, the resistive elements constituting the resistance division circuit 82 of the reference voltage generation circuit 80 are arranged in the first region ARA. In this way, of the reference voltage generation circuit 80, at least the resistive elements of the resistance division circuit 82 are arranged in the first region ARA. By arranging the resistive elements of the resistance division circuit 82 of the reference voltage generation circuit 80 in the first region ARA in this manner, the resistive elements of the resistance division circuit 82 can be arranged in a region close to the end of the base 2, and thus the arrangement area of the integrated circuit 10 can be enlarged. In addition, since the circuit characteristic of the resistance division circuit 82 is set using the resistance ratio, even when the resistive elements of the resistance division circuit 82 are arranged in the first region ARA where an applied stress is larger, the bad influence exerted by the deterioration in the circuit characteristic caused by the stress is minimized.

The first circuit is the regulator circuit 81 configured to generate a regulated voltage to be used in the integrated circuit 10, and the first circuit element is the resistive elements provided in the resistance division circuit 83 of the regulator circuit 81. That is, in FIG. 21, the resistive elements constituting the resistance division circuit 83 of the regulator circuit 81 are arranged in the first region ARA. In this way, of the regulator circuit 81, at least the resistive elements of the resistance division circuit 83 are arranged in the first region ARA. By arranging the resistive elements of the resistance division circuit 83 of the regulator circuit 81 in the first region ARA in this manner, the resistive elements of the resistance division circuit 83 can be arranged in a region close to the end of the base 2, and thus the arrangement area of the integrated circuit 10 can be enlarged. In addition, since the circuit characteristic of the resistance division circuit 83 is set using the resistance ratio, even when the resistive elements of the resistance division circuit 83 are arranged in the first region ARA where the applied stress is larger, the bad influence exerted by the deterioration in the circuit characteristic caused by the stress is minimized.

The first circuit is the temperature sensor circuit 16 configured to detect a temperature, and the first circuit element is the plurality of transistors provided in the current mirror circuit 84 of the temperature sensor circuit 16. That is, in FIG. 21, the plurality of transistors constituting the current mirror circuit 84 of the temperature sensor circuit 16 are arranged in the first region ARA. In this way, of the temperature sensor circuit 16, at least the plurality of transistors of the current mirror circuit 84 are arranged in the first region ARA. By arranging the plurality of transistors of the current mirror circuit 84 of the temperature sensor circuit 16 in the first region ARA in this manner, the plurality of transistors of the current mirror circuit 84 can be arranged in a region close to the end of the base 2, and thus the arrangement area of the integrated circuit 10 can be enlarged. Further, since the circuit characteristic of the current mirror circuit 84 is set using the size ratio of the plurality of transistors, even when the plurality of transistors of the current mirror circuit 84 are arranged in the first region ARA where the applied stress is larger, the bad influence exerted by the deterioration in the circuit characteristic caused by the stress is minimized.

The first circuit is the control circuit 13 or the memory 17, and the first circuit element is transistors provided in the control circuit 13 or the memory 17. In this way, as illustrated in FIG. 21, at least some of the transistors constituting the control circuit 13 or the memory 17 are arranged in the first region ARA. By arranging the transistors of the control circuit 13 or the memory 17 in the first region ARA in this manner, the transistors of the control circuit 13 or the memory 17 can be arranged in a region close to the end of the base 2, and thus the arrangement area of the integrated circuit 10 can be enlarged. Even when a stress is applied to the transistors of the control circuit 13 and the memory 17 and a circuit characteristic of the transistors changes, circuit characteristics of the control circuit 13 and the memory 17 are unlikely to be affected. For example, since the control circuit 13 is a circuit configured to perform a logic operation and the like, even when a circuit characteristic such as a threshold of the transistors changes due to stress application, the logic operation is unlikely to be affected, and it is considered that there is no malfunction of the control circuit 13. In addition, even when a circuit characteristic such as a threshold of transistors in a reading circuit and a writing circuit of the memory 17 changes, a reading operation and a writing operation of the memory are unlikely to be affected, and it is considered that there is no malfunction of the memory 17.

The second circuit element is a passive element, and the passive element is at least one of a capacitive element and a resistive element. In this way, the capacitive element and the resistive element as the second circuit element are arranged in the second region ARB. For example, when the stress described with reference to FIG. 7 is applied to the capacitive element and the resistive element, a capacitance and a resistance may change, but the applied stress is smaller in the second region ARB than that in the first region ARA. Accordingly, when the capacitive element and the resistive element are arranged in the second region ARB where the applied stress is smaller, the change in the capacitance and the resistance due to the stress can be minimized, and a change in circuit characteristic of the second circuit including, for example, the capacitive element and the resistive element as the second circuit element can be reduced to the minimum. The capacitive element is, for example, a metal-insulator-metal (MIM) capacitor, a polysilicon-insulator-polysilicon (PIP) capacitor, or a metal-oxide-semiconductor (MOS) capacitor. The resistive element is, for example, a polysilicon resistor, a diffused resistor, or a well resistor.

As illustrated in FIG. 21, the second circuit is the oscillation circuit 11 configured to oscillate the vibration element 5, and the second circuit element is at least one of the capacitive element and the resistive element provided in the oscillation circuit 11. In this way, the capacitive element and the resistive element of the oscillation circuit 11 as the second circuit element are arranged in the second region ARB. For example, when a stress is applied to the capacitive element and the resistive element, a capacitance and a resistance may change, but the applied stress is smaller in the second region ARB than that in the first region ARA. Accordingly, when the capacitive element or the resistive element of the oscillation circuit 11 is disposed in the second region ARB where the applied stress is smaller, the change in the capacitance or the resistance due to the stress can be minimized, and a change in circuit characteristic of the oscillation circuit 11 including the capacitive element or the resistive element can be reduced to the minimum. For example, in a case where the capacitive element is a capacitive element constituting the variable capacitance circuit 86 of the oscillation circuit 11, when the capacitance of the capacitive element changes due to stress application, an oscillation frequency also fluctuates. In this regard, when the capacitive element of the variable capacitance circuit 86 of the oscillation circuit 11 is disposed in the second region ARB where the applied stress is smaller, the fluctuation in the oscillation frequency caused by the stress application can be reduced to the minimum.

As illustrated in FIG. 21, the second circuit is the temperature compensation circuit 15 configured to perform temperature compensation for an oscillation frequency of the vibration element 5, and the second circuit element is a resistive element provided in the temperature compensation circuit 15. In this way, the resistive element of the temperature compensation circuit 15 as the second circuit element is disposed in the second region ARB. When the resistive element of the temperature compensation circuit 15 is disposed in the second region ARB where the applied stress is smaller, a change in resistance due to the stress can be minimized, and a change in circuit characteristic of the temperature compensation circuit 15 can also be reduced to the minimum. For example, in the temperature compensation circuit 15, when a resistance value of the resistive element changes due to stress application, a temperature compensation characteristic also fluctuates. In this regard, when the resistive element of the temperature compensation circuit 15 is disposed in the second region ARB where the applied stress is smaller, the fluctuation in the temperature compensation characteristic caused by the stress application can be reduced to the minimum.

6. Configuration Examples of Respective Circuits of Integrated Circuit

Figure 22:
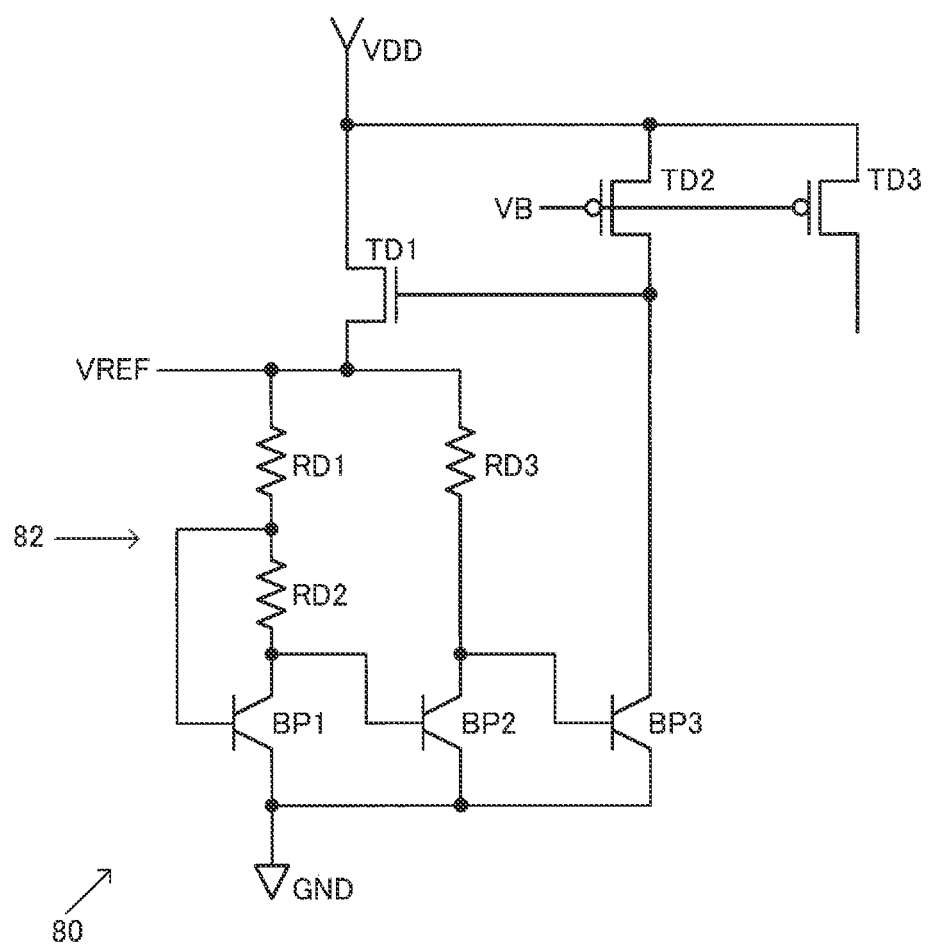
FIG. 22 illustrates a configuration example of a reference voltage generation circuit.

Next, specific configuration examples of respective circuits of the integrated circuit 10 will be described. FIG. 22 illustrates a configuration example of the reference voltage generation circuit 80. The reference voltage generation circuit 80 includes an N-type transistor TD1, resistors RD1, RD2, and RD3, and bipolar transistors BP1 and BP2 that are provided between a VDD node and a GND node. The reference voltage generation circuit 80 includes P-type transistors TD2 and TD3 to whose gates a bias voltage VB is input, and a bipolar transistor BP3 provided between a drain node of the transistor TD2 and the GND node. The reference voltage generation circuit 80 is a bandgap reference circuit, and generates and outputs a reference voltage VREF based on a bandgap voltage. For example, voltages between bases and emitters of the PNP bipolar transistors BP1 and BP2 are defined as VBE1 and VBE2, and ΔVBE=VBE1−VBE2. The reference voltage generation circuit 80 outputs the reference voltage VREF of VREF=K×ΔVBE+VBE2, for example. K is set based on resistance values of the resistors RD1 and RD2. For example, since VBE2 has a negative temperature characteristic and ΔVBE has a positive temperature characteristic, the reference voltage VREF of a constant voltage having no temperature dependence can be generated by adjusting the resistance values of the resistors RD1 and RD2. The generated reference voltage VREF is a constant voltage based on a ground voltage. The reference voltage generation circuit 80 is not limited to the configuration in FIG. 22, and for example, circuits of various configurations such as a circuit configured to generate the reference voltage VREF using a work function difference voltage of a transistor can be used.

In the reference voltage generation circuit 80 in FIG. 22, the resistance division circuit 82 is implemented by the resistors RD1 and RD2 that are resistive elements. The reference voltage VREF=K×ΔVBE+VBE2 is set using K corresponding to a resistance ratio of RD1 and RD2 in the resistance division circuit 82. Therefore, even when the resistance values of the resistors RD1 and RD2 as resistive elements fluctuate due to stress application, fluctuation in K corresponding to the resistance ratio is the minimum, and thus fluctuation in the reference voltage VREF is also reduced to the minimum. Therefore, even when the resistance division circuit 82 of the reference voltage generation circuit 80 is disposed in the first region ARA where the applied stress is larger, the fluctuation in the reference voltage VREF that is a circuit characteristic of the reference voltage generation circuit 80 can be prevented. By disposing the reference voltage generation circuit 80 in the first region ARA close to the end of the base 2, the arrangement area of the integrated circuit 10 can be enlarged.

Figure 23:
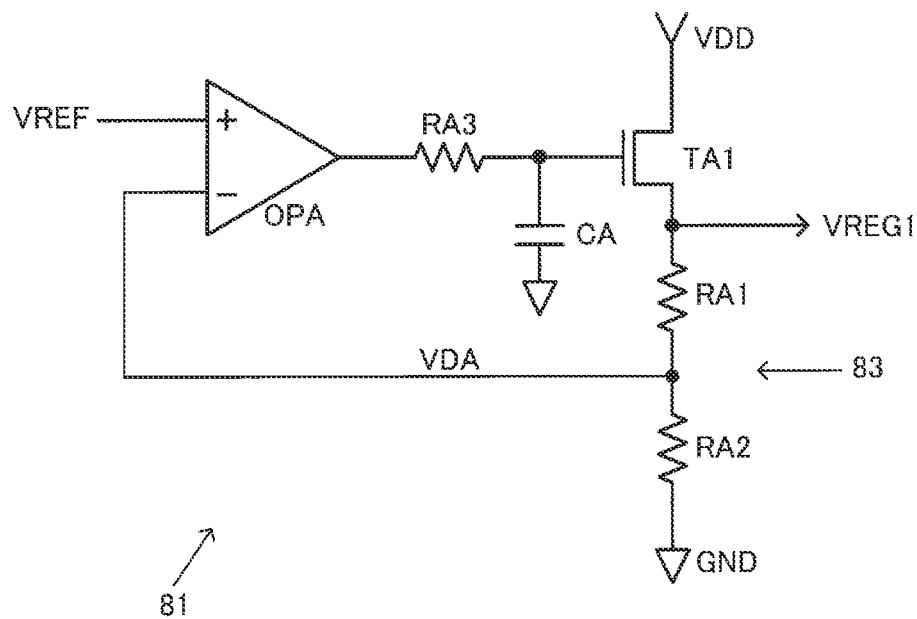
FIG. 23 illustrates a configuration example of a regulator circuit.

FIG. 23 illustrates a configuration example of the regulator circuit 81. The regulator circuit 81 includes an N-type driving transistor TA1 and resistors RA1 and RA2 provided in series between a VDD node and a GND node, and an operational amplifier OPA. The regulator circuit 81 may include a resistor RA3 and a capacitor CA provided on an output terminal side of the operational amplifier OPA. The reference voltage VREF is input to a non-inverting input terminal of the operational amplifier OPA, and a voltage VDA obtained by dividing a regulated voltage VREG1 by the resistors RA1 and RA2 is input to an inverting input terminal. An output terminal of the operational amplifier OPA is coupled to a gate of the transistor TA1 via the resistor RA3, and the regulated voltage VREG1 is output from a drain node of the transistor TA1. When resistance values of the resistors RA1 and RA2 are defined as R1 and R2, the regulator circuit 81 outputs the regulated voltage VREG1={(R1+R2)/R2}×VREF.

In the regulator circuit 81 in FIG. 23, the resistance division circuit 83 is implemented by the resistors RA1 and RA2 that are resistive elements. The regulated voltage VREG1={(R1+R2)/R2}×VREF is set using a resistance ratio based on RA1 and RA2. Therefore, even when the resistance values of the resistors RA1 and RA2 as resistive elements fluctuate due to stress application, fluctuation in the resistance ratio is the minimum, and thus fluctuation in the regulated voltage VREG1 is also reduced to the minimum. Therefore, even when the resistance division circuit 83 of the regulator circuit 81 is disposed in the first region ARA where the applied stress is larger, the fluctuation in the regulated voltage VREG1 that is a circuit characteristic of the regulator circuit 81 can be prevented. By disposing the regulator circuit 81 in the first region ARA close to the end of the base 2, the arrangement area of the integrated circuit 10 can be enlarged.

Figure 24:
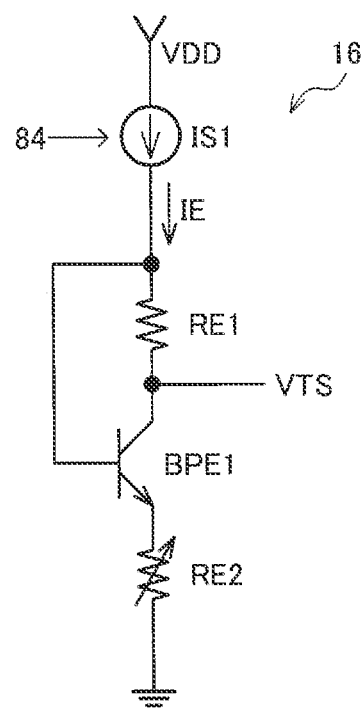
FIG. 24 illustrates a configuration example of a temperature sensor circuit.

FIG. 24 illustrates a first configuration example of the temperature sensor circuit 16. The temperature sensor circuit 16 includes a constant current source IS1, a bipolar transistor BPE1, and resistors RE1 and RE2. The constant current source IS1, the resistor RE1, the bipolar transistor BPE1, and the resistor RE2 are provided in series between a VDD node and a GND node. Specifically, a coupling node of the constant current source IS1 and one end of the resistor RE1 is coupled to a base of the bipolar transistor BPE1, and the other end of the resistor RE1 is coupled to a collector of the bipolar transistor BPE1. An emitter of the bipolar transistor BPE1 is coupled to one end of the resistor RE2, and the other end of the resistor RE2 is coupled to the GND node. The resistor RE2 is a variable resistor, and a resistance value of the resistor RE2 is set based on zero-order correction data from the memory 17.

In FIG. 24, when a current flowing from the constant current source IS1 is defined as IE, the resistance values of the resistors RE1 and RE2 are defined as R1 and R2, respectively, and a voltage between the base and the emitter of the bipolar transistor BPE1 is defined as VBE1, a temperature detection voltage is VTS=VBE1+IE×(R2−R1). As described, the temperature detection voltage VTS contains IE×(R2−R1) as an offset component, and the offset of the temperature detection voltage VTS can be adjusted by changing the resistance value R2 of the resistor RE2.

Figure 25:
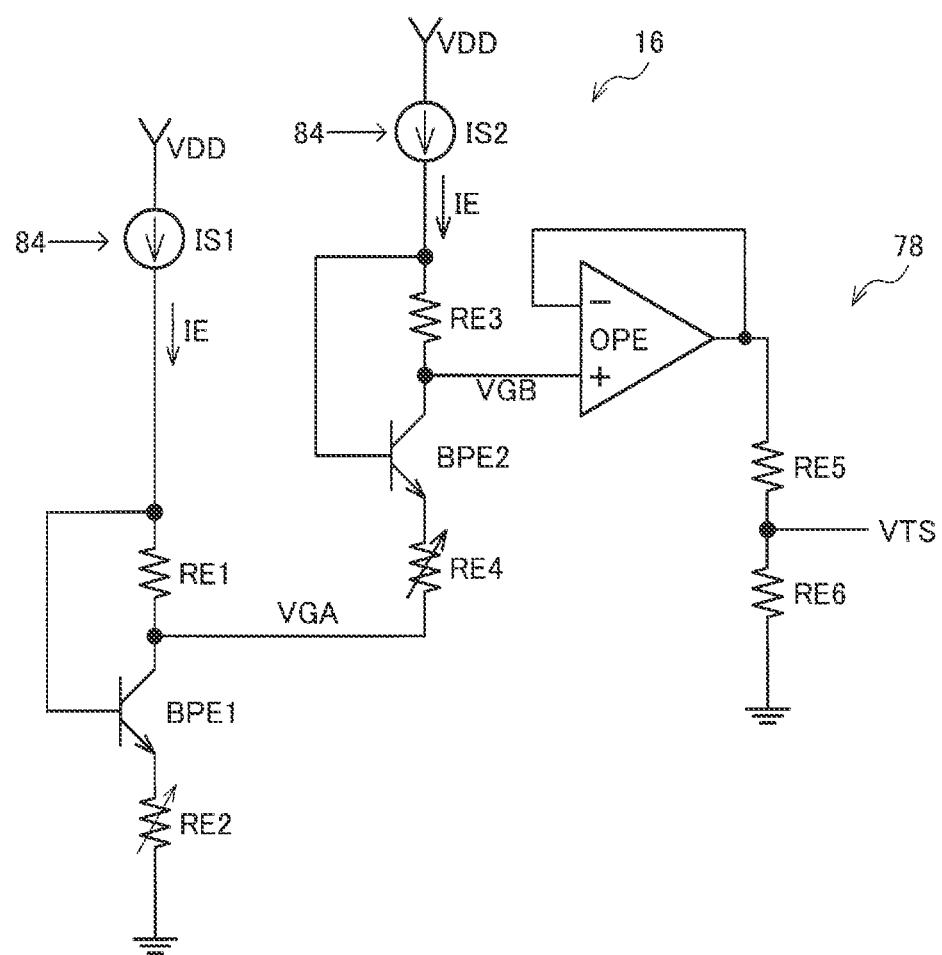
FIG. 25 illustrates a configuration example of a temperature sensor circuit.

FIG. 25 illustrates a second configuration example of the temperature sensor circuit 16. The temperature sensor circuit 16 in FIG. 25 includes constant current sources IS1 and IS2, bipolar transistors BPE1 and BPE2, resistors RE1, RE2, RE3, and RE4, and a buffer circuit 78.

A coupling configuration of the constant current source IS1, the bipolar transistor BPE1, and the resistors RE1 and RE2 is similar to that of the first configuration example in FIG. 24. The constant current source IS2, the resistor RE3, the bipolar transistor BPE2, and the resistor RE4 are provided in series between a VDD node and a node of a collector of the bipolar transistor BPE1. Specifically, a coupling node of the constant current source IS2 and one end of the resistor RE3 is coupled to a base of the bipolar transistor BPE2, and the other end of the resistor RE3 is coupled to a collector of the bipolar transistor BPE2. An emitter of the bipolar transistor BPE2 is coupled to one end of the resistor RE4, and the other end of the resistor RE4 is coupled to the collector of the bipolar transistor BPE1. The resistor RE4 is a variable resistor, and a resistance value of the resistor RE4 is set based on, for example, zero-order correction data from the memory 17.

The buffer circuit 78 includes an operational amplifier OPE and resistors RE5 and RE6. A voltage VGB, which is a collector voltage of the bipolar transistor BPE2, is input to a non-inverting input terminal of the operational amplifier OPE. An inverting input terminal of the operational amplifier OPE is coupled to one end of the resistor RE5, the other end of the resistor RE5 is coupled to one end of the resistor RE6, and the other end of the resistor RE6 is coupled to a GND node. Accordingly, a voltage obtained by dividing an output voltage of the operational amplifier OPE by the resistors RE5 and RE6 is output as the temperature detection voltage VTS from a coupling node of the resistors RE5 and RE6. The output voltage of the operational amplifier OPE is a voltage obtained by adding an offset voltage of the operational amplifier OPE to the voltage VGB.

In FIG. 25, collector voltages of the bipolar transistors BPE1 and BPE2 are defined as VGA and VGB, respectively, currents flowing through the constant current sources IS1 and IS2 are defined as IE, and resistance values of the resistors RE1, RE2, RE3, RE4, RE5, and RE6 are defined as R1, R2, R3, R4, R5, and R6, respectively. Voltages between bases and emitters of the bipolar transistors BPE1 and BPE2 are defined as VBE1 and VBE2. In that case, VGA=VBE1+IE×(2R2−R1), and VGB=VBE2+IE×(R4−R3)+VGA=VBE1+VBE2+IE×(2R2+R4−R1−R3). Accordingly, the temperature detection voltage is VTS=(R5/R6)×VGB. The VGB contains IE×(2R2+R4−R1−R3) as an offset component, and the temperature detection voltage VTS also contains (R5/R6)×IE×(2R2+R4−R1−R3) as an offset component. That is, the offset of the temperature detection voltage VTS can be adjusted by changing the resistance value R2 of the resistor RE2 and the resistance value R4 of the resistor RE4.

In the temperature sensor circuits 16 in FIGS. 24 and 25, the constant current sources IS1 and IS2 are implemented by the current mirror circuit 84. That is, the current IE obtained by current-mirroring a reference current by the current mirror circuit 84 flows from the constant current sources IS1 and IS2. The current mirror circuit 84 is implemented by a first transistor whose drain and gate are coupled and through which a reference current flows from a source to the drain, and a second transistor whose gate is coupled to the gate of the first transistor and through which a current IE flows. A mirror ratio of the current mirror circuit 84 is set using a transistor size ratio between the first transistor and the second transistor. Therefore, even when circuit characteristics of the first transistor and the second transistor fluctuate due to stress application, fluctuation in the transistor size ratio is the minimum, and thus fluctuation in the current IE is also reduced to the minimum. Therefore, even when the current mirror circuit 84 of the temperature sensor circuit 16 is disposed in the first region ARA where the applied stress is larger, fluctuation in the temperature detection voltage that is a circuit characteristic of the temperature sensor circuit 16 can be prevented. By disposing the temperature sensor circuit 16 in the first region ARA close to the end of the base 2, the arrangement area of the integrated circuit 10 can be enlarged.

Figure 26:
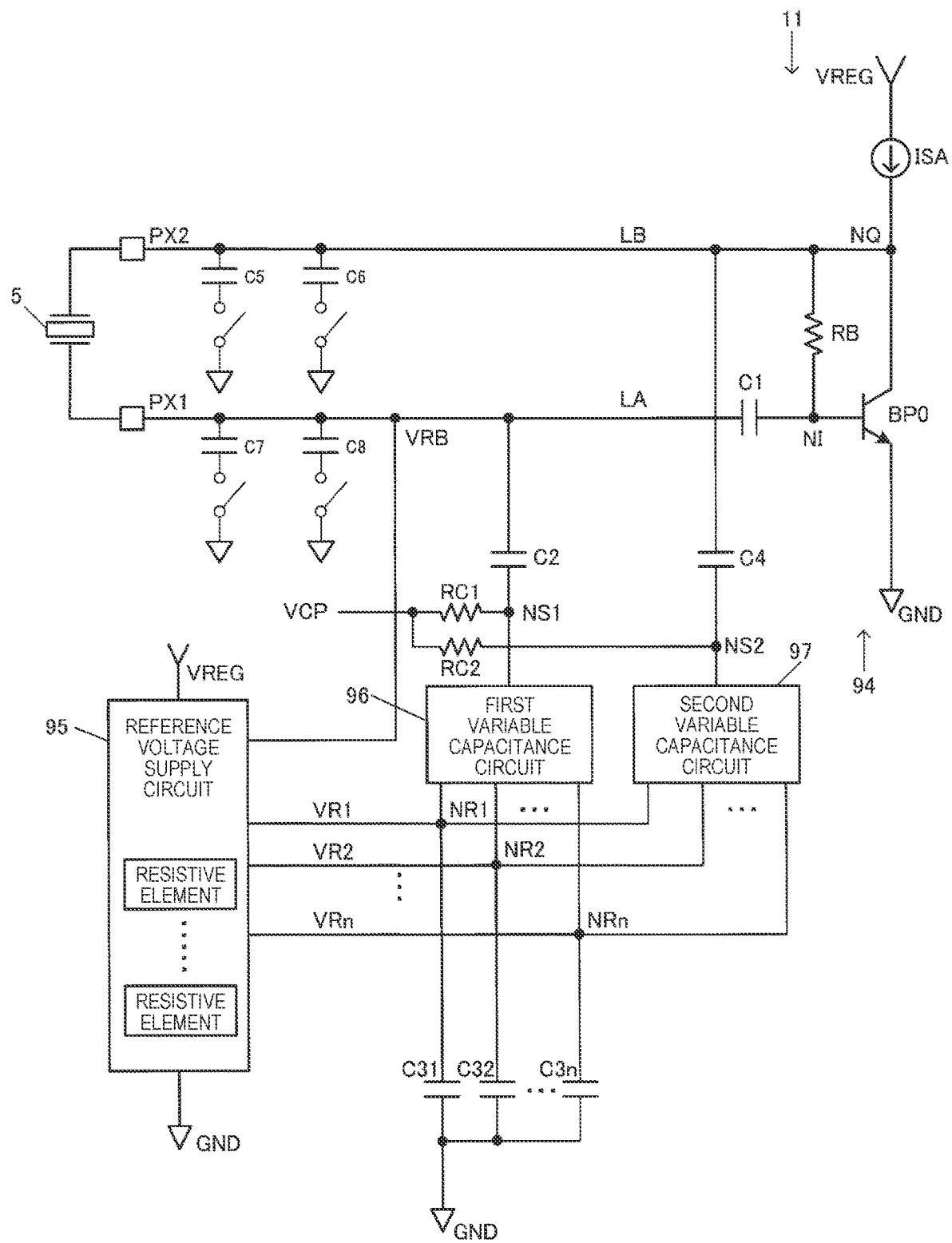
FIG. 26 illustrates a configuration example of an oscillation circuit.

FIG. 26 illustrates a configuration example of the oscillation circuit 11. The oscillation circuit 11 includes a drive circuit 94, DC-cut capacitors C1, C2, C4, a reference voltage supply circuit 95, a first variable capacitance circuit 96, and a second variable capacitance circuit 97. The capacitor C4 and the second variable capacitance circuit 97 may be omitted. Capacitors C31 to C3n are provided between the first variable capacitance circuit 96 and the second variable capacitance circuit 97, and a GND node.

The drive circuit 94 is a circuit configured to drive and oscillate the vibration element 5. The drive circuit 94 includes a current source ISA, a bipolar transistor BP0, and a resistor RB. The current source ISA is provided between a power supply node of a regulated voltage VREG and the bipolar transistor BP0, and supplies a constant current to the bipolar transistor BP0.

The bipolar transistor BP0 is a transistor configured to drive the vibration element 5, and a base node thereof is an input node NI of the drive circuit 94 and a collector node thereof is an output node NQ of the drive circuit 94. The resistor RB is provided between the collector node and the base node of the bipolar transistor BP0.

The DC-cut capacitor C1 is provided between the input node NI of the drive circuit 94 and a wiring LA. By providing such a capacitor C1, a DC component of an oscillation signal is cut off, and only an AC component is transmitted to the input node NI of the drive circuit 94, and it is possible to properly operate the bipolar transistor BP0.

The reference voltage supply circuit 95 supplies reference voltages VR1 to VRn to the first variable capacitance circuit 96 and the second variable capacitance circuit 97. The reference voltage supply circuit 95 includes, for example, a plurality of resistive elements provided in series between a node of the regulated voltage VREG and a node of GND, and outputs voltages obtained by dividing the voltage of VREG as the reference voltages VR1 to VRn. The reference voltage supply circuit 95 supplies a reference voltage VRB for bias voltage setting to the wiring LA. Accordingly, an amplitude center voltage of the oscillation signal in the wiring LA can be set to the reference voltage VRB.

The DC-cut capacitor C2 has one end coupled to the wiring LA and the other end coupled to a supply node NS1 of a temperature compensation voltage VCP. The temperature compensation voltage VCP is supplied to the supply node NS1 via a resistor RC1. The first variable capacitance circuit 96 has one end coupled to the supply node NS1 and is supplied with the temperature compensation voltage VCP. The reference voltage supply circuit 95 supplies the reference voltages VR1 to VRn to supply nodes NR1 to NRn at the other end of the first variable capacitance circuit 96. The capacitors C31 to C3n are provided between the supply nodes NR1 to NRn of the reference voltages VR1 to VRn and a GND node.

The first variable capacitance circuit 96 includes n variable capacitance elements. Further, n is an integer of 2 or more. The n variable capacitance elements are MOS type variable capacitance elements, for example, and are implemented by n transistors. The reference voltages VR1 to VRn are supplied to gates of the n transistors. A source and a drain of each of the n transistors are short-circuited, and the temperature compensation voltage VCP is supplied to the supply node NS1 to which the short-circuited source and drain are coupled. A capacitance of the DC-cut capacitor C2 is sufficiently larger than a capacitance of the first variable capacitance circuit 96. By using the first variable capacitance circuit 96 having such a configuration, linearity of a capacitance change of the total capacitance of the first variable capacitance circuit 96 can be secured in a wide voltage range of the temperature compensation voltage VCP. A coupling configuration of the second variable capacitance circuit 97 and the capacitor C4 is similar to the coupling configuration of the first variable capacitance circuit 96 and the capacitor C2, and thus a detailed description thereof is omitted.

In the embodiment, the capacitive elements of the first variable capacitance circuit 96 and the second variable capacitance circuit 97 of the oscillation circuit 11 and the resistive element of the reference voltage supply circuit 95 are arranged in the second region ARB where the applied stress is smaller. For example, when capacitances of capacitive elements such as varactors of the first variable capacitance circuit 96 and the second variable capacitance circuit 97 fluctuate due to stress application, a load capacitance fluctuates, and thus an oscillation frequency also fluctuates. Further, when a resistance of the resistive element of the reference voltage supply circuit 95 fluctuates due to stress application and the reference voltages VR1 to VRn fluctuate, the voltages applied to the capacitive elements of the first variable capacitance circuit 96 and the second variable capacitance circuit 97 fluctuate. Accordingly, the load capacitance fluctuates, and the oscillation frequency also fluctuates. In this regard, in the embodiment, since the capacitive elements and the resistive elements of the oscillation circuit 11 are arranged in the second region ARB where the applied stress is smaller, it is possible to prevent fluctuation in a circuit characteristic such as fluctuation in the oscillation frequency caused by the stress application.

Figure 27:
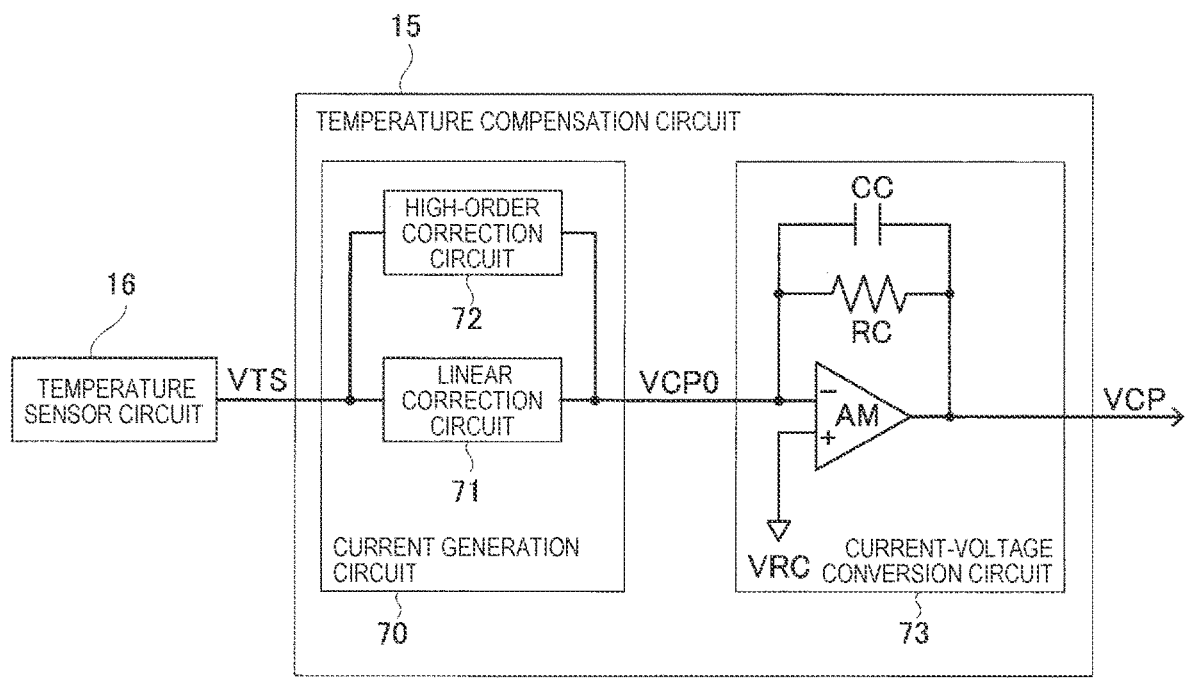
FIG. 27 illustrates a configuration example of a temperature compensation circuit.

FIG. 27 illustrates a configuration example of the temperature compensation circuit 15. FIG. 27 illustrates a circuit configured to perform analog temperature compensation, and output the temperature compensation voltage VCP by polynomial approximation using a temperature as a variable. The temperature compensation circuit 15 includes a current generation circuit 70 and a current-voltage conversion circuit 73. The current generation circuit 70 generates a function current for temperature compensating a frequency-temperature characteristic of the vibration element 5, based on the temperature detection voltage VTS from the temperature sensor circuit 16. The current-voltage conversion circuit 73 converts the function current from the current generation circuit 70 into a voltage and outputs the temperature compensation voltage VCP.

The current generation circuit 70 includes a linear correction circuit 71 and a higher-order correction circuit 72. The linear correction circuit 71 outputs a linear current approximating a linear function based on the temperature detection voltage VTS. For example, the linear correction circuit 71 outputs the linear current based on linear correction data corresponding to a linear coefficient of a polynomial in polynomial approximation. The high-order correction circuit 72 outputs a high-order current approximating a high-order function to the current-voltage conversion circuit 73 based on the temperature detection voltage VTS. For example, the high-order correction circuit 72 outputs a high-order current based on high-order correction data corresponding to a high-order coefficient of a polynomial in polynomial approximation. For example, the high-order correction circuit 72 outputs a cubic current approximating a cubic function. The high-order correction circuit 72 may further include a correction circuit configured to perform quartic or higher-order correction.

The current-voltage conversion circuit 73 includes an amplifier circuit AM, a resistor RC, and a capacitor CC. The current-voltage conversion circuit 73 adds the linear current and the high-order current, and performs current-voltage conversion on the added current to output the temperature compensation voltage VCP. Accordingly, the temperature compensation voltage VCP approximating a polynomial function is generated.

Figure 28:
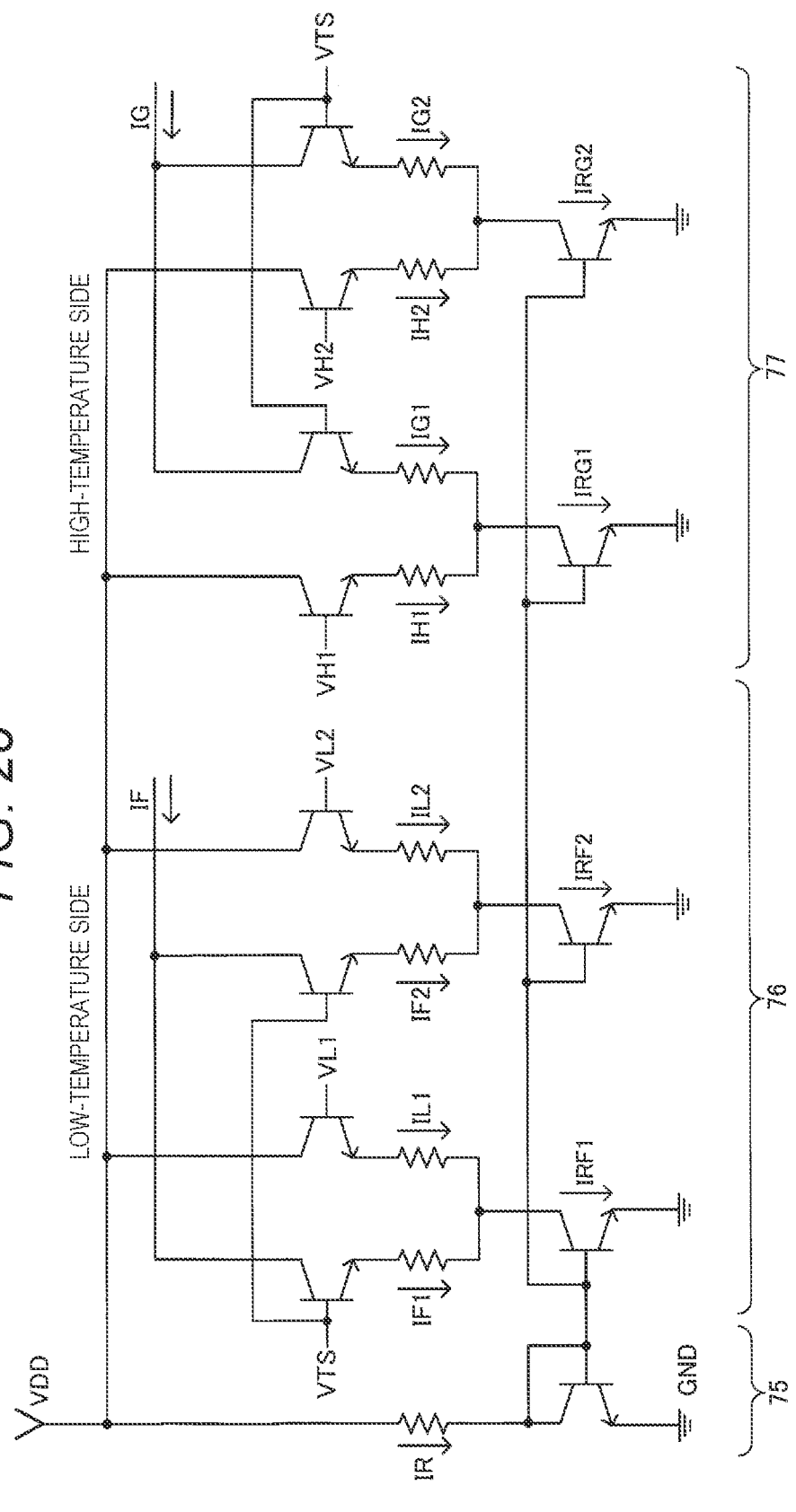
FIG. 28 illustrates a configuration example of a function current generation circuit of the temperature compensation circuit.

FIG. 28 illustrates a configuration example of a function current generation circuit 74 provided in the temperature compensation circuit 15. The function current generation circuit 74 is provided, for example, in the high-order correction circuit 72 in FIG. 27, and generates high-order function currents such as quadratic and cubic function currents.

As illustrated in FIG. 28, the function current generation circuit 74 includes a reference current generation circuit 75, a first compensation circuit 76, and a second compensation circuit 77. The reference current generation circuit 75 generates a reference current IR. The first compensation circuit 76 performs temperature compensation in a low-temperature range, and the second compensation circuit 77 performs temperature compensation in a high-temperature range. The first compensation circuit 76 and the second compensation circuit 77 include a plurality of differential pair circuits. Reference currents IRF1 and IRF2 obtained by mirroring the reference current IR flow through the differential pair circuits of the first compensation circuit 76. Reference currents IRG1 and IRG2 obtained by mirroring the reference current IR also flow through the differential pair circuits of the second compensation circuit 77. The first compensation circuit 76 generates a current IF=IF1+IF2 for temperature compensation in the low-temperature range, and the second compensation circuit 77 generates a current IG=IG1+IG2 for temperature compensation in the high-temperature range. Since the reference current IR is a constant current, the reference current IRF1=IF1+IL1 and the reference current IRF2=IF2+IL2 flowing through the differential pair circuits of the first compensation circuit 76 are also constant currents having constant current values. The reference current IRG1=IG1+IH1 and the reference current IRG2=IG2+IH2 flowing through the differential pair circuits of the second compensation circuit 77 are also constant currents having constant current values.

In the low-temperature range, the current IF=IF1+IF2 increases, whereas the current IG=IG1+IG2 decreases. On the other hand, in the high-temperature range, the current IG=IG1+IG2 increases, whereas the current IF=IF1+IF2 decreases. By using the function current generation circuit 74, it is possible to generate a high-order function current such as a quadratic, cubic, quartic, or quintic function current.

In the embodiment, in the function current generation circuit 74 of the temperature compensation circuit 15, resistive elements through which the currents IF1, IL1, IF2, IL2, IH1, IG1, IH2, and IG2 flow are arranged in the second region ARB where the applied stress is smaller. For example, when resistance values of the resistive elements fluctuate, the currents IF and IG for temperature compensation also fluctuate, and the temperature compensation voltage VCP also fluctuates. Accordingly, the temperature compensation of an oscillation frequency is not appropriately performed, and the oscillation frequency after the temperature compensation also fluctuates. In this regard, in the embodiment, since the resistive elements of the temperature compensation circuit 15 are arranged in the second region ARB where the applied stress is smaller, it is possible to prevent fluctuation in the circuit characteristic such as fluctuation in the temperature compensation and the fluctuation in the oscillation frequency caused by stress application.

7. Layout Arrangement of Integrated Circuit

Figure 29:
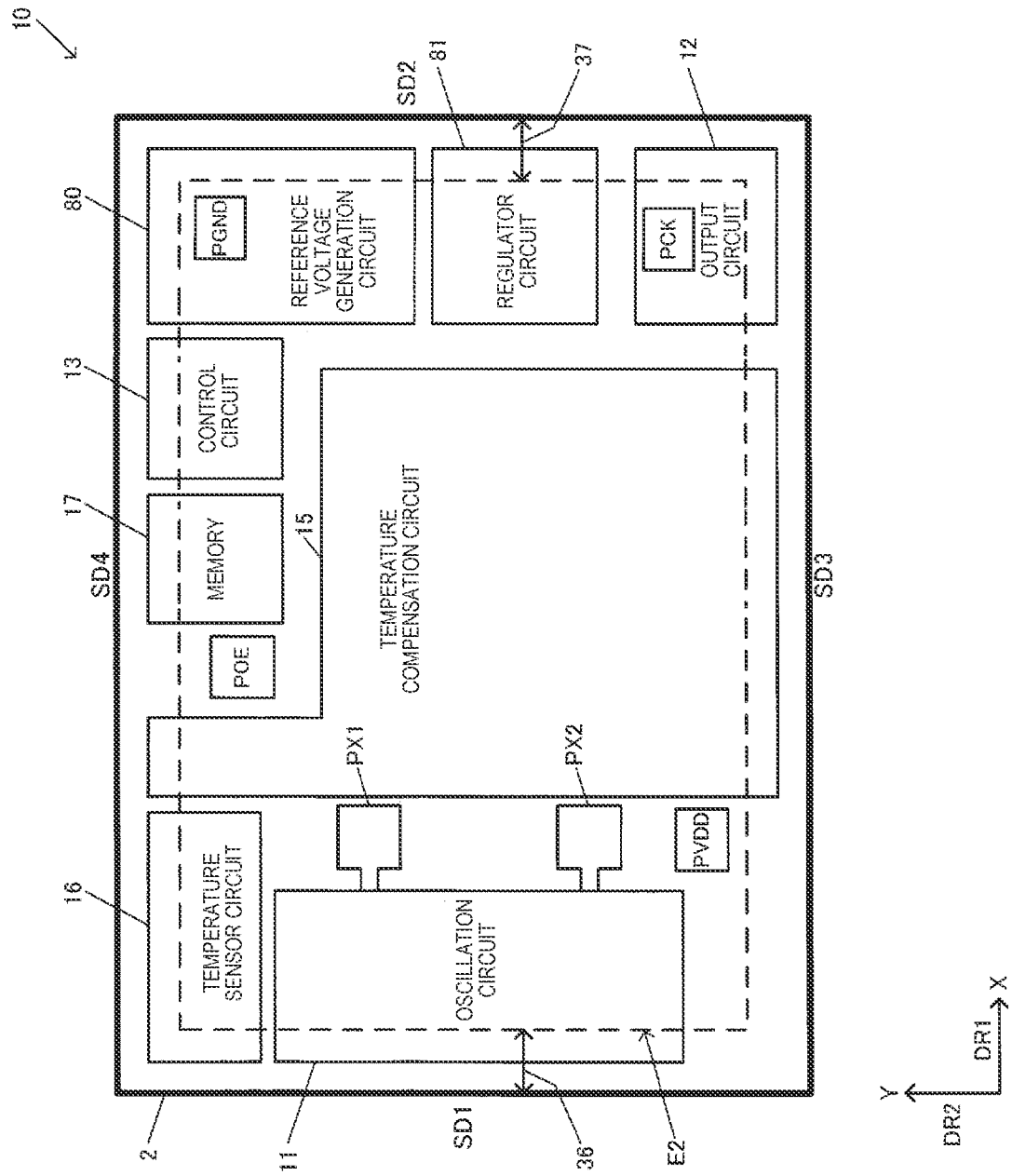
FIG. 29 illustrates a layout arrangement example of the integrated circuit.
Figure 30:
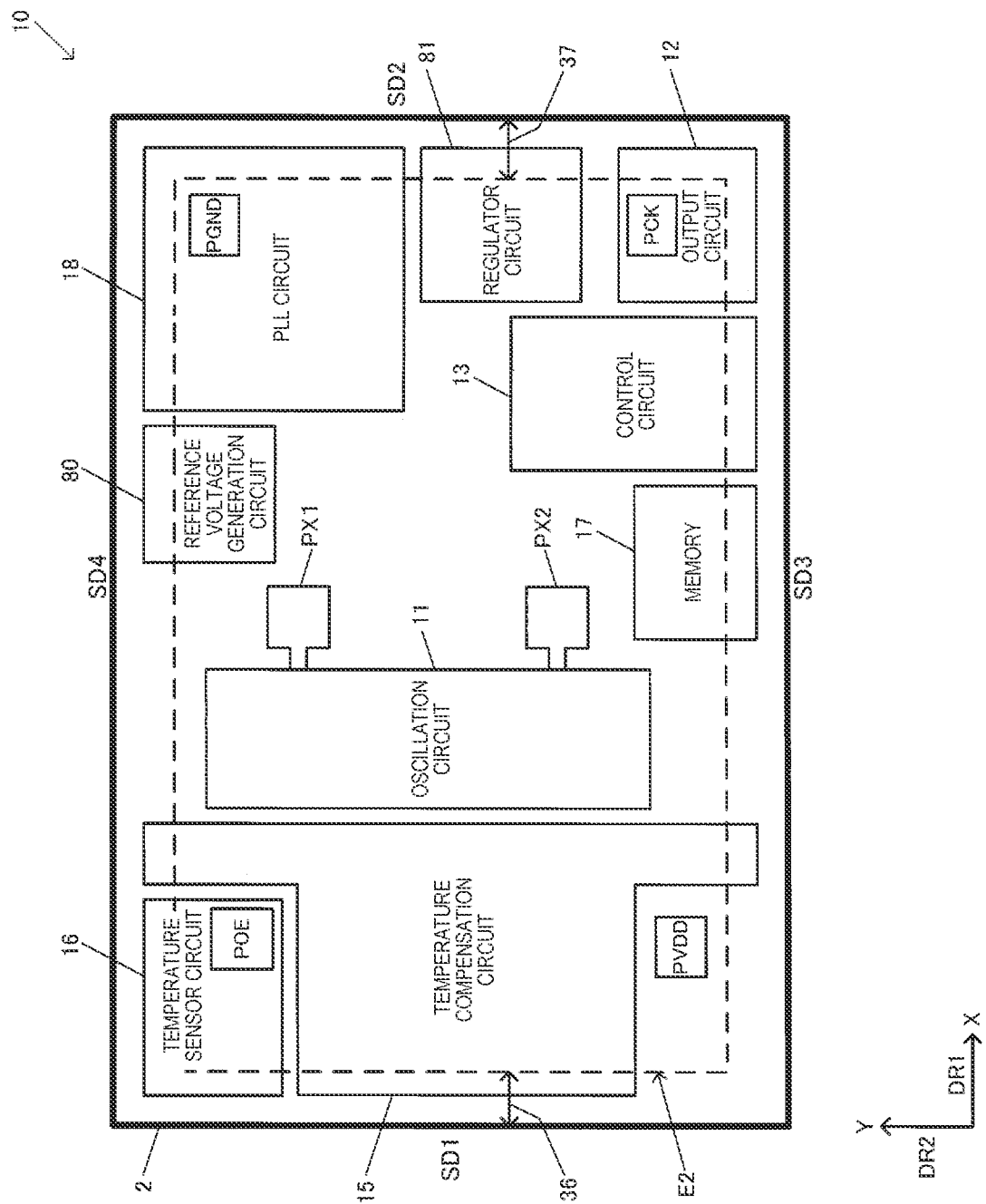
FIG. 30 illustrates a layout arrangement example of the integrated circuit.

FIGS. 29 and 30 illustrate layout arrangement examples of the integrated circuit 10. FIG. 29 illustrates a layout arrangement example of the integrated circuit 10 having the configuration example in FIG. 19, and FIG. 30 is a layout arrangement example of the integrated circuit 10 having the configuration example in FIG. 20. In FIGS. 29 and 30, E2 indicates an inner boundary of the bonding portions 36 and 37 in the plan view described with reference to FIG. 1. The first region ARA described with reference to FIG. 18 and the like is a region overlapping the bonding portions 36 and 37 in the plan view. In FIGS. 29 and 30, the pads PX1 and PX2 coupled to the oscillation circuit 11 are coupled to the vibration element 5, and accordingly the vibration element 5 and the integrated circuit 10 can be electrically coupled to each other.

In FIG. 29, the oscillation circuit 11 is disposed along the first side SD1 of the base 2. The temperature compensation circuit 15 is disposed in a central portion of the base 2, and the pads PX1 and PX2 for coupling to the vibration element 5 are disposed between the oscillation circuit 11 and the temperature compensation circuit 15. The temperature sensor circuit 16, the memory 17, the control circuit 13, and the reference voltage generation circuit 80 are arranged along the fourth side SD4 of the base 2. The reference voltage generation circuit 80, the regulator circuit 81, and the output circuit 12 are arranged along the second side SD2. Specifically, the temperature sensor circuit 16 is disposed at a corner portion where the first side SD1 and the fourth side SD4 intersect, and the reference voltage generation circuit 80 is disposed at a corner portion where the fourth side SD4 and the second side SD2 intersect. The output circuit 12 is disposed at a corner portion where the second side SD2 and the third side SD3 intersect.

In FIG. 29, the reference voltage generation circuit 80 and the regulator circuit 81 are arranged in a manner of partially overlapping at least the first region ARA described with reference to FIG. 18 and the like. Specifically, the plurality of resistive elements provided in the resistance division circuit 82 of the reference voltage generation circuit 80, the plurality of resistive elements provided in the resistance division circuit 83 of the regulator circuit 81, and the like are arranged in the first region ARA. By disposing the first circuit element, which is the resistive elements, in the first region ARA, it is possible to enlarge the arrangement area of the integrated circuit 10 while preventing the fluctuation in the circuit characteristics of the reference voltage generation circuit 80 and the regulator circuit 81 due to stress application.

The temperature sensor circuit 16 is disposed in a manner of at least partially overlapping the first region ARA. Specifically, the plurality of transistors of the current mirror circuit 84 provided in the temperature sensor circuit 16 are arranged in the first region ARA. By disposing the first circuit element, which is the transistors, in the first region ARA, it is possible to enlarge the arrangement area of the integrated circuit 10 while preventing the fluctuation in the circuit characteristic of the temperature sensor circuit 16 due to stress application.

The control circuit 13 and the memory 17 are arranged in a manner of at least partially overlapping the first region ARA. Specifically, at least some of the transistors constituting the control circuit 13 and the memory 17 are arranged in the first region ARA. By disposing the first circuit element, which is the transistors, in the first region ARA, it is possible to enlarge the arrangement area of the integrated circuit 10 while preventing fluctuation in circuit characteristics of the control circuit 13 and the memory 17 due to stress application.

Further, the temperature compensation circuit 15 is disposed in the vicinity of the center, and is disposed in a manner of at least partially overlapping the second region ARB. Specifically, the resistive elements provided in the temperature compensation circuit 15 are arranged in the second region ARB. By disposing the second circuit element, which is the resistive elements, in the second region ARB, it is possible to prevent the resistance values of the resistive elements from fluctuating due to stress application, and to prevent the circuit characteristic in the temperature compensation of the temperature compensation circuit 15 from deteriorating. The capacitive elements or the resistive elements of the oscillation circuit 11 are preferably arranged in the second region ARB.

In FIG. 30, the PLL circuit 18 is further provided. The oscillation circuit 11 is disposed in the vicinity of the central portion and coupled to the pads PX1 and PX2. The temperature sensor circuit 16, the reference voltage generation circuit 80, and the PLL circuit 18 are arranged along the fourth side SD4 of the base 2. The PLL circuit 18, the regulator circuit 81, and the output circuit 12 are arranged along the second side SD2, and the memory 17, the control circuit 13, and the output circuit 12 are disposed along the third side SD3. Specifically, the temperature sensor circuit 16 is disposed at a corner portion where the first side SD1 and the fourth side SD4 intersect, and the PLL circuit 18 is disposed at a corner portion where the fourth side SD4 and the second side SD2 intersect. The output circuit 12 is disposed at a corner portion where the second side SD2 and the third side SD3 intersect.

Also in FIG. 30, the plurality of resistive elements of the resistance division circuits 82 and 83 of the reference voltage generation circuit 80 and the regulator circuit 81, the plurality of transistors of the current mirror circuit 84 of the temperature sensor circuit 16, and the transistors of the control circuit 13 and the memory 17 are arranged in the first region ARA. Accordingly, it is possible to enlarge the arrangement area of the integrated circuit 10 while preventing the fluctuation in the circuit characteristics.

By arranging the capacitive elements or the resistive elements of the oscillation circuit 11 in the second region ARB, it is possible to prevent the capacitance values of the capacitive elements or the resistance values of the resistive elements from fluctuating due to stress application, and to prevent the circuit characteristics such as the oscillation frequency of the oscillation circuit 11 from deteriorating. The resistive elements of the temperature compensation circuit 15 are also preferably arranged in the second region ARB.

As described above, the vibrator device according to the embodiment includes: a base including a semiconductor substrate that has a first surface and a second surface in a front and back relationship with the first surface and that has an integrated circuit disposed at the first surface; a vibration element electrically coupled to the integrated circuit; and a lid provided with a recess for accommodating the vibration element, including a side wall around the recess, and having an end surface of the side wall bonded to the first surface at a bonding portion. Further, the integrated circuit includes a first circuit, and the first circuit includes a first circuit element disposed in a first region of the first surface, the first region overlapping the bonding portion in a plan view orthogonal to the first surface. The first circuit element is a passive element or a transistor, and θ<90° is satisfied, θ being an angle formed by the first surface and an inner side surface of the side wall.

The vibrator device according to the embodiment includes: the base including the semiconductor substrate having the integrated circuit disposed at the first surface; the vibration element electrically coupled to the integrated circuit; and the lid having the end surface of the side wall bonded to the first surface at the bonding portion. Accordingly, a small-sized vibrator device can be implemented. The first circuit of the integrated circuit includes the first circuit element disposed in the first region overlapping the bonding portion in the plan view. The inner side surface of the side wall of the lid is inclined such that θ<90°, θ being the angle formed by the first surface and the inner side surface of the side wall. As described, by inclining the inner side surface of the side wall, a stress caused by a load can be dispersed. Accordingly, a stress in a region in the vicinity of the bonding portion is reduced, and a stress applied to the first circuit element in the first region can be reduced, and thus deterioration in performance of the vibrator device caused by the stress can be prevented.

In the embodiment, θ≤80° may be satisfied. In this way, it is possible to further reduce the stress in the region in the vicinity of the bonding portion compared to the case where the relationship of θ<90° is satisfied, and it is possible to further reduce the stress applied to the first circuit element in the first region.

In the embodiment, in the lid, the inner side surface may be along a crystal orientation <111> of single crystal silicon.

In this way, the stress in the region in the vicinity of the bonding portion can be reduced, and the inclination of the inner side surface of the side wall can be formed using the crystal orientation <111> of single crystal silicon.

In the embodiment, θ>45° may be satisfied.

In this way, it is possible to prevent a situation where a restriction is posed on an arrangement space of the vibration element since the angle θ is made unnecessarily small.

In the embodiment, the lid may be formed of a second semiconductor wafer bonded, via the bonding portion by stress application, to a first semiconductor wafer forming the base.

In this way, the first semiconductor wafer and the second semiconductor wafer are bonded to each other, and dicing or the like is performed, whereby a large number of vibrator devices can be separated.

Further, in the embodiment, the integrated circuit may include a second circuit, the first surface may include a second region, the first region may surround the second region in a plan view orthogonal to the first surface, the second circuit may include a second circuit element disposed in the second region, and the first circuit element or the first circuit may be a circuit element or a circuit having a smaller change in circuit characteristic with respect to a stress than the second circuit element or the second circuit.

In this way, the first circuit element can be disposed in the first region where an applied stress is larger, and an arrangement area of the integrated circuit can be enlarged. The second circuit element can be disposed in the second region where the applied stress is smaller, and deterioration in circuit characteristic caused by the stress can be prevented.

In the embodiment, the first circuit may be a circuit whose circuit characteristic is set using a ratio of a circuit constant of the first circuit element.

As described above, in the case of the first circuit whose circuit characteristic is set using the ratio of the circuit constant of the first circuit element, even when the first circuit element is disposed in the first region, it is possible to prevent the deterioration in the circuit characteristic caused by stress application.

In the embodiment, the first circuit may be a circuit in which a plurality of passive elements or a plurality of active elements are provided as the first circuit element, and whose circuit characteristic is set using a ratio of a circuit constant of the plurality of passive elements or the plurality of active elements.

As described above, in the case of the first circuit whose circuit characteristic is set using the ratio of the circuit constant of the plurality of passive elements or the plurality of active elements, even when the passive elements or the active elements are arranged in the first region, it is possible to prevent the deterioration in the circuit characteristic caused by stress application.

In the embodiment, the first circuit element may be a resistive element provided in a resistance voltage divider circuit or a transistor provided in a current mirror circuit.

In the case of the resistive element of the resistance division circuit or the transistor of the current mirror circuit, it is possible to prevent deterioration in the circuit characteristic caused by stress application even when the resistive element or the transistor is disposed in the first region.

In the embodiment, the first circuit may be a reference voltage generation circuit configured to generate a reference voltage to be used in the integrated circuit, and the first circuit element may be a resistive element provided in a resistance division circuit of the reference voltage generation circuit.

As described above, by disposing the resistive element of the resistance division circuit of the reference voltage generation circuit in the first region, the arrangement area of the integrated circuit can be enlarged. In addition, since a circuit characteristic of the resistance division circuit is set using a resistance ratio, even when the resistive element is disposed in the first region, it is possible to prevent deterioration in the circuit characteristic caused by a stress.

In the embodiment, the first circuit may be a regulator circuit configured to generate a regulated voltage to be used in the integrated circuit, and the first circuit element may be a resistive element provided in a resistance division circuit of the regulator circuit.

As described, by disposing the resistive element of the resistance division circuit of the regulator circuit in the first region, the arrangement area of the integrated circuit can be enlarged. In addition, since a circuit characteristic of the resistance division circuit is set using a resistance ratio, even when the resistive element is disposed in the first region, it is possible to prevent deterioration in the circuit characteristic caused by a stress.

In the embodiment, the first circuit may be a temperature sensor circuit configured to detect a temperature, and the first circuit element may be a transistor provided in a current mirror circuit of the temperature sensor circuit.

As described, by disposing the transistor of the current mirror circuit of the temperature sensor circuit in the first region, the arrangement area of the integrated circuit can be enlarged. In addition, since a circuit characteristic of the current mirror circuit is set using a size ratio of the transistor, even when the transistor of the current mirror circuit is disposed in the first region, deterioration in the circuit characteristic caused by a stress can be prevented.

In the embodiment, the first circuit may be a control circuit or a memory, and the first circuit element may be a transistor provided in the control circuit or the memory.

As described, by disposing the transistor of the control circuit or the memory in the first region, the arrangement area of the integrated circuit can be enlarged. Even when a stress is applied to the transistor of the control circuit or the memory and a circuit characteristic of the transistor changes, the circuit characteristic of the control circuit or the memory can be maintained.

In the embodiment, the integrated circuit may include a second circuit, the first surface may include a second region, the first region may surround the second region in a plan view orthogonal to the first surface, the second circuit may include a second circuit element disposed in the second region, and the second circuit element may be at least one of a capacitive element and a resistive element.

As described, when the capacitive element or the resistive element is disposed in the second region where an applied stress is small, it is possible to prevent fluctuation in a capacitance or a resistance due to the stress.

In the embodiment, the integrated circuit may include a second circuit, the first surface may include a second region, the first region may surround the second region in a plan view orthogonal to the first surface, the second circuit may include a second circuit element disposed in the second region, the second circuit may be an oscillation circuit configured to oscillate the vibration element, and the second circuit element may be at least one of a capacitive element and a resistive element provided in the oscillation circuit.

As described above, when the capacitive element or the resistive element of the oscillation circuit is disposed in the second region where an applied stress is small, it is possible to prevent fluctuation in a capacitance or a resistance due to the stress and to prevent fluctuation in a circuit characteristic of the oscillation circuit.

In the embodiment, the integrated circuit may include a second circuit, the first surface may include a second region, the first region may surround the second region in a plan view orthogonal to the first surface, the second circuit may include a second circuit element disposed in the second region, the second circuit may be a temperature compensation circuit configured to perform temperature compensation for an oscillation frequency of the vibration element, and the second circuit element may be a resistive element provided in the temperature compensation circuit.

As described, when the resistive element of the temperature compensation circuit is disposed in the second region where an applied stress is small, it is possible to prevent fluctuation in a resistance due to the stress and to prevent fluctuation in a circuit characteristic of the temperature compensation circuit.

Although the embodiment is described in detail above, it can be easily understood by those skilled in the art that a number of modifications can be made without substantially departing from the novel matters and effects of the disclosure. Accordingly, all such modifications are within the scope of the disclosure. For example, a term described at least once together with a different term having a broader meaning or the same meaning in the description or the drawings can be replaced with the different term at any place in the description or the drawings. All combinations of the embodiment and the modifications are also included in the scope of the disclosure. The configurations, operations, and the like of the vibrator device are not limited to those described in the embodiment, and various modifications can be made.

What is claimed is:

1. A vibrator device comprising:
a base including a semiconductor substrate that has a first surface and a second surface in a front and back relationship with the first surface and that has an integrated circuit disposed at the first surface;
a vibration element electrically coupled to the integrated circuit; and
a lid provided with a recess for accommodating the vibration element, including a side wall around the recess, and having an end surface of the side wall bonded to the first surface at a bonding portion, wherein
the integrated circuit includes a first circuit,
the first circuit includes a first circuit element disposed in a first region of the first surface, the first region overlapping the bonding portion in a plan view orthogonal to the first surface,
the first circuit element is a passive element or a transistor,
$\theta<90°$, $\theta$ being an angle formed by the first surface and an inner side surface of the side wall,
the integrated circuit includes a second circuit,
the first surface includes a second region,
the first region surrounds the second region in a plan view orthogonal to the first surface, and
the second circuit includes a second circuit element disposed in the second region.

2. The vibrator device according to claim 1, wherein $\theta \leq 80°$.

3. The vibrator device according to claim 1, wherein in the lid, the inner side surface is along a crystal orientation <111> of single crystal silicon.

4. The vibrator device according to claim 1, wherein $\theta > 45°$.

5. The vibrator device according to claim 1, wherein the lid is formed of a second semiconductor wafer bonded, via the bonding portion by stress application, to a first semiconductor wafer forming the base.

6. The vibrator device according to claim 1, wherein the first circuit element is a circuit element having a smaller change in circuit characteristic with respect to a stress than the second circuit element.

7. The vibrator device according to claim 1, wherein the first circuit is a circuit having a smaller change in circuit characteristic with respect to a stress than the second circuit.

8. The vibrator device according to claim 1, wherein the first circuit is a circuit whose circuit characteristic is set using a ratio of a circuit constant of the first circuit element.

9. The vibrator device according to claim 1, wherein the first circuit is a circuit in which a plurality of passive elements or a plurality of active elements are provided as the first circuit element, and whose circuit characteristic is set using a ratio of a circuit constant of the plurality of passive elements or the plurality of active elements.

10. The vibrator device according to claim 1, wherein the first circuit element is a resistive element provided in a resistance voltage divider circuit or a transistor provided in a current mirror circuit.

11. The vibrator device according to claim 1, wherein the first circuit is a reference voltage generation circuit configured to generate a reference voltage to be used in the integrated circuit, and
the first circuit element is a resistive element provided in a resistance division circuit of the reference voltage generation circuit.

12. The vibrator device according to claim 1, wherein
the first circuit is a regulator circuit configured to generate a regulated voltage to be used in the integrated circuit, and
the first circuit element is a resistive element provided in a resistance division circuit of the regulator circuit.

13. The vibrator device according to claim 1, wherein
the first circuit is a temperature sensor circuit configured to detect a temperature, and
the first circuit element is a transistor provided in a current mirror circuit of the temperature sensor circuit.

14. The vibrator device according to claim 1, wherein
the first circuit is a control circuit or a memory, and
the first circuit element is a transistor provided in the control circuit or the memory.

15. The vibrator device according to claim 1, wherein
the second circuit element is at least one of a capacitive element and a resistive element.

16. The vibrator device according to claim 1, wherein
the second circuit is an oscillation circuit configured to oscillate the vibration element, and
the second circuit element is at least one of a capacitive element and a resistive element provided in the oscillation circuit.

17. The vibrator device according to claim 1, wherein
the second circuit is a temperature compensation circuit configured to perform temperature compensation for an oscillation frequency of the vibration element, and
the second circuit element is a resistive element provided in the temperature compensation circuit.

18. A vibrator device comprising:
a base including a semiconductor substrate that has a first surface and a second surface in a front and back relationship with the first surface and that has an integrated circuit disposed at the first surface;
a vibration element electrically coupled to the integrated circuit; and
a lid provided with a recess for accommodating the vibration element, including a side wall around the recess, and having an end surface of the side wall bonded to the first surface at a bonding portion, wherein
the integrated circuit includes a first circuit,
the first circuit includes a first circuit element disposed in a first region of the first surface, the first region overlapping the bonding portion in a plan view orthogonal to the first surface,
the first circuit element is a passive element or a transistor,
$\theta<90°$, $\theta$ being an angle formed by the first surface and an inner side surface of the side wall, and
the first circuit is a circuit in which a plurality of passive elements or a plurality of active elements are provided as the first circuit element, and whose circuit characteristic is set using a ratio of a circuit constant of the plurality of passive elements or the plurality of active elements.

19. A vibrator device comprising:
a base including a semiconductor substrate that has a first surface and a second surface in a front and back relationship with the first surface and that has an integrated circuit disposed at the first surface;
a vibration element electrically coupled to the integrated circuit; and
a lid provided with a recess for accommodating the vibration element, including a side wall around the recess, and having an end surface of the side wall bonded to the first surface at a bonding portion, wherein
the integrated circuit includes a first circuit,
the first circuit includes a first circuit element disposed in a first region of the first surface, the first region overlapping the bonding portion in a plan view orthogonal to the first surface,
the first circuit element is a passive element or a transistor,
$\theta<90°$, $\theta$ being an angle formed by the first surface and an inner side surface of the side wall, and
the first circuit is a reference voltage generation circuit configured to generate a reference voltage to be used in the integrated circuit or the first circuit is a regulator circuit configured to generate a regulated voltage to be used in the integrated circuit.

* * * * *